(12) United States Patent
Chen

(10) Patent No.: US 11,893,885 B2
(45) Date of Patent: Feb. 6, 2024

(54) SYSTEM AND METHOD FOR PARKING DETECTION AND IDENTIFICATION OF MOVEABLE APPARATUS

(71) Applicant: National Central University, Taoyuan (TW)

(72) Inventor: Chien-Chih Chen, Taoyuan (TW)

(73) Assignee: NATIONAL CENTRAL UNIVERSITY, Taoyuan (TW)

( * ) Notice: Subject to any disclaimer, the term of this patent is extended or adjusted under 35 U.S.C. 154(b) by 249 days.

(21) Appl. No.: 17/358,747

(22) Filed: Jun. 25, 2021

(65) Prior Publication Data

US 2021/0319693 A1   Oct. 14, 2021

Related U.S. Application Data

(63) Continuation-in-part of application No. 16/668,646, filed on Oct. 30, 2019.

(60) Provisional application No. 63/116,343, filed on Nov. 20, 2020.

(30) Foreign Application Priority Data

Feb. 1, 2019   (TW) .................................. 108104269

(51) Int. Cl.
| | |
|---|---|
| *G01R 33/04* | (2006.01) |
| *G01R 33/09* | (2006.01) |
| *G08G 1/042* | (2006.01) |
| *G01R 33/022* | (2006.01) |
| *G01R 33/00* | (2006.01) |

(52) U.S. Cl.
CPC ......... *G08G 1/042* (2013.01); *G01R 33/0094* (2013.01); *G01R 33/022* (2013.01); *G01R 33/04* (2013.01); *G01R 33/091* (2013.01)

(58) Field of Classification Search
CPC .......................... G01R 33/0091; G01R 33/04
See application file for complete search history.

(56) References Cited

U.S. PATENT DOCUMENTS

| | | | |
|---|---|---|---|
| 6,611,210 B2* | 8/2003 | Hilliard | G08G 1/042 340/917 |
| 8,493,237 B2* | 7/2013 | Grievink | G08G 1/14 705/418 |
| 10,916,141 B1* | 2/2021 | Wiesenberg | G08G 1/146 |

\* cited by examiner

*Primary Examiner* — Reena Aurora
(74) *Attorney, Agent, or Firm* — MUNCY, GEISSLER, OLDS & LOWE, P.C.

(57) ABSTRACT

A method for parking detection and identification of moveable apparatus, comprising following steps of: generating a magnetic field signal containing an unique identifier for identifying the moveable apparatus by a magnetic field generator disposed in the moveable apparatus; measuring magnetic field respectively by two magnetic field sensors of a magnetic field sensing apparatus disposed in a moveable-apparatus parking place or its peripheral area, wherein a first and a second magnetic field measurements are measured; and calculating a magnetic field measurement difference for obtaining the unique identifier, wherein the magnetic field measurement difference is a magnitude of a difference of the first and the second magnetic field measurements, or a magnitude of a difference of a first magnetic field component of the first magnetic field measurement along a characteristic direction and a second magnetic field component of the second magnetic field measurement along the characteristic direction.

20 Claims, 13 Drawing Sheets

SYSTEM AND METHOD FOR PARKING DETECTION AND IDENTIFICATION OF MOVEABLE APPARATUS

CROSS-REFERENCE TO RELATED DOCUMENTS

The present invention is a continuation in part (CIP) to a U.S. patent application Ser. No. 16/668,646 entitled "NEAR MAGNETIC FIELD VARIATION DETECTION SYSTEM AND DETECTION METHOD THEREOF" filed on Oct. 30, 2019, now published as Pub. No. 20200249285. The present invention also claims the benefit of and priority to U.S. Provisional Patent Application No. 63/116,343, entitled "SYSTEM AND METHOD FOR PARKING DETECTION AND IDENTIFICATION OF MOVEABLE APPARATUS" filed on Nov. 20, 2020, the disclosure of which is incorporated in its entirety by reference herein. The disclosures of each of the foregoing applications are incorporated herein by reference in their entireties.

FIELD OF THE INVENTION

The present invention is related to a system and method for parking detection and identification of moveable apparatus, especially a system and method for parking detection and identification of moveable apparatus using magnetic field sensing apparatus for both parking detection and identification.

BACKGROUND OF THE INVENTION

Conventional technology uses a camera to identify vehicles. However, in order to identify the vehicle parked in each parking grid, it is needed to install a camera on each parking grid, which will cause excessive costs. Conventional technology uses a single magnetic field sensor to detect whether a vehicle is parked in a parking grid. But there is no conventional technology that uses the same magnetic field sensor to identify the vehicle.

Accordingly, the present invention has developed a new design which may avoid the above-described drawbacks, may significantly enhance the performance of the devices and may take into account economic considerations. Therefore, the present invention then has been invented.

SUMMARY OF THE INVENTION

The main technical problem that the present invention is seeking to solve is how to use a magnet field sensing apparatus to detect whether a moveable apparatus enters a moveable apparatus parking place, and use the same magnetic field sensing apparatus to identify the moveable apparatus.

In order to solve the above-described problems and to achieve the expected effect, the present invention provides a method for parking detection and identification of moveable apparatus, comprising following steps of; generating a magnetic field signal by a magnetic field generator disposed in the moveable apparatus, wherein the magnetic field signal contains an unique identifier for identifying the moveable apparatus; and measuring magnetic field by (a) a first magnetic field sensor and a second magnetic field sensor of a magnetic field sensing apparatus respectively and calculating a magnetic field measurement difference by a data processing unit for obtaining the unique identifier from the magnetic field measurement difference, wherein the magnetic field sensing apparatus is disposed in a moveable apparatus parking place or a peripheral area of the moveable apparatus parking place, wherein a first magnetic field measurement and a second magnetic field measurement are measured by the first magnetic field sensor and the second magnetic field sensor respectively, wherein the magnetic field measurement difference is (1) a magnitude of a difference of the first magnetic field measurement and the second magnetic field measurement, or (2) a magnitude of a difference of a first magnetic field component of the first magnetic field measurement along a characteristic direction and a second magnetic field component of the second magnetic field measurement along the characteristic direction, or (b) one of a first magnetic field sensor and a second magnetic field sensor of a magnetic field sensing apparatus, a magnetic field measurement is measured, and obtaining the unique identifier from (1) the magnetic field measurement, or (2) a magnetic field component of the magnetic field measurement along a characteristic direction by a data processing unit, wherein the magnetic field sensing apparatus is disposed in a moveable apparatus parking place or a peripheral area of the moveable apparatus parking place.

In some implementations, wherein before the magnetic field generator starts generating the magnetic field signal, the method further comprises following steps of: measuring magnetic field by the first magnetic field sensor and the second magnetic field sensor respectively, wherein a front stage first magnetic field measurement and a front stage second magnetic field measurement are measured by the first magnetic field sensor and the second magnetic field sensor respectively; and calculating a front stage magnetic field measurement difference by the data processing unit, wherein the front stage magnetic field measurement difference is (1) a magnitude of a difference of the front stage first magnetic field measurement and the front stage second magnetic field measurement, or (2) a magnitude of a difference of a front stage first magnetic field component of the front stage first magnetic field measurement along the characteristic direction and a front stage second magnetic field component of the front stage second magnetic field measurement along the characteristic direction, wherein a first near magnetic field variation for detecting the moveable apparatus entering the moveable apparatus parking place is occurred when (a) the front stage magnetic field measurement difference is continuously greater than a first characteristic threshold within a first characteristic time period, or (b) an average value of the front stage magnetic field measurement difference is greater than a first characteristic average threshold within a first characteristic average time period.

In some implementations, wherein after the unique identifier is obtained, the method further comprises following steps of: stopping generating the magnetic field signal by the magnetic field generator, measuring magnetic field by the first magnetic field sensor and the second magnetic field sensor respectively, wherein a rear stage first magnetic field measurement and a rear stage second magnetic field measurement are measured by the first magnetic field sensor and the second magnetic field sensor respectively; and calculating a rear stage magnetic field measurement difference by the data processing unit, wherein the rear stage magnetic field measurement difference is (1) a magnitude of a difference of the rear stage first magnetic field measurement and the rear stage second magnetic field measurement, or (2) a magnitude of a difference of a rear stage first magnetic field component of the rear stage first magnetic field measurement along the characteristic direction and a rear stage second magnetic field component of the rear stage second magnetic field measurement along the characteristic direction, wherein a second near magnetic field variation for detecting the moveable apparatus leaving the moveable apparatus parking place is occurred when (a) the rear stage magnetic field measurement difference is continuously smaller than a second characteristic threshold within a second characteristic time period, or (b) an average value of the rear stage magnetic field measurement difference is smaller than a second characteristic average threshold within a second characteristic average time period.

In some implementations, wherein the step of stopping generating the magnetic field signal by the magnetic field generator comprises following steps of: emitting a terminating signal by a transmitter disposed in the moveable apparatus parking place or the peripheral area of the moveable apparatus parking place; and receiving the terminating signal by a receiver disposed in the moveable apparatus, wherein the magnetic field generator is stopped generating the magnetic field signal by the terminating signal.

In some implementations, wherein the step of generating the magnetic field signal by the magnetic field generator comprises following steps of: emitting a starting signal by a transmitter disposed in the moveable apparatus parking place or the peripheral area of the moveable apparatus parking place; and receiving the starting signal by a receiver disposed in the moveable apparatus, wherein the magnetic field generator is activated to start generating the magnetic field signal by the starting signal.

Moreover, the present invention further provides a system for parking detection and identification of moveable apparatus, comprising a data processing unit, a magnetic field generator, and a magnetic field sensing apparatus. The magnetic field generator is disposed in the moveable apparatus, wherein the magnetic field generator is used for generating a magnetic field signal containing an unique identifier for identifying the moveable apparatus. The magnetic field sensing apparatus is disposed in a moveable apparatus parking place or a peripheral area of the moveable apparatus parking place. The magnetic field sensing apparatus includes a first magnetic field sensor and a second magnetic field sensor for measuring magnetic field respectively, wherein (a) a first magnetic field measurement and a second magnetic field measurement are measured by the first magnetic field sensor and the second magnetic field sensor respectively, the data processing unit calculates a magnetic field measurement difference for obtaining the unique identifier, wherein the magnetic field measurement difference is (1) a magnitude of a difference of the first magnetic field measurement and the second magnetic field measurement, or (2) a magnitude of a difference of a first magnetic field component of the first magnetic field measurement along a characteristic direction and a second magnetic field component of the second magnetic field measurement along the characteristic direction: or (b) a magnetic field measurement is measured by one of the first magnetic field sensor and the second magnetic field sensor, the data processing unit obtains the unique identifier from (1) the magnetic field measurement, or (2) a magnetic field component of the magnetic field measurement along a characteristic direction.

In some implementations, wherein before the magnetic field generator starts generating the magnetic field signal, a front stage first magnetic field measurement and a front stage second magnetic field measurement are measured by the first magnetic field sensor and the second magnetic field sensor respectively, the data processing unit calculates a front stage magnetic field measurement difference, wherein the front stage magnetic field measurement difference is (1) a magnitude of a difference of the front stage first magnetic field measurement and the front stage second magnetic field measurement, or (2) a magnitude of a difference of a front stage first magnetic field component of the front stage first magnetic field measurement along the characteristic direction and a front stage second magnetic field component of the front stage second magnetic field measurement along the characteristic direction, wherein a first near magnetic field variation for detecting the moveable apparatus entering the moveable apparatus parking place is occurred when (a) the front stage magnetic field measurement difference is continuously greater than a first characteristic threshold within a first characteristic time period, or (b) an average value of the front stage magnetic field measurement difference is greater than a first characteristic average threshold within a first characteristic average time period.

In some implementations, wherein after the unique identifier is obtained, the magnetic field generator stops generating the magnetic field signal, a rear stage first magnetic field measurement and a rear stage second magnetic field measurement are measured by the first magnetic field sensor and the second magnetic field sensor respectively, the data processing unit calculates a rear stage magnetic field measurement difference, wherein the rear stage magnetic field measurement difference is (1) a magnitude of a difference of the rear stage first magnetic field measurement and the rear stage second magnetic field measurement, or (2) a magnitude of a difference of a rear stage first magnetic field component of the rear stage first magnetic field measurement along the characteristic direction and a rear stage second magnetic field component of the rear stage second magnetic field measurement along the characteristic direction, wherein a second near magnetic field variation for detecting the moveable apparatus leaving the moveable apparatus parking place is occurred when (a) the rear stage magnetic field measurement difference is continuously smaller than a second characteristic threshold within a second characteristic time period, or (b) an average value of the rear stage magnetic field measurement difference is smaller than a second characteristic average threshold within a second characteristic average time period.

In some implementations, it further comprises a receiver disposed in the moveable apparatus and a transmitter disposed in the moveable apparatus parking place or the peripheral area of the moveable apparatus parking place, wherein the transmitter is used for emitting a terminating signal, wherein when the receiver receives the terminating signal, the magnetic field generator is stopped generating the magnetic field signal by the terminating signal.

In some implementations, it further comprises a receiver disposed in the moveable apparatus and a transmitter disposed in the moveable apparatus parking place or the peripheral area of the moveable apparatus parking place, wherein the transmitter is used for emitting a starting signal, wherein when the receiver receives the starting signal, the magnetic field generator is activated to start generating the magnetic field signal by the starting signal.

In some implementations, wherein the moveable apparatus is one selected from the group consisting of: a land vehicle, a sea vehicle, a flight vehicle, a tram, a cable car, and a railed vehicle.

In some implementations, wherein the moveable apparatus parking place has an entrance, wherein the magnetic field sensing apparatus is disposed non-adjacent to the entrance.

In some implementations, wherein the peripheral area includes any one of the above, the under, and the surrounding of the moveable apparatus parking place.

In some implementations, the characteristic direction is (1) approximately pointing to the moveable apparatus parking place, (2) approximately parallel to a geomagnetic inclination direction of the location of the moveable apparatus parking place, or (3) approximately parallel to a geomagnetic declination direction of the location of the moveable apparatus parking place.

In some implementations, wherein a first distance between the first magnetic field sensor and the moveable apparatus parking place is not equal to a second distance between the second magnetic field sensor and the moveable apparatus parking place.

In some implementations, wherein a first distance between the first magnetic field sensor and the moveable apparatus parking place is greater than or equal to a sensor relative distance between the first magnetic field sensor and the second magnetic field sensor.

In some implementations, wherein a second distance between the second magnetic field sensor and the moveable apparatus parking place is greater than or equal to the sensor relative distance.

In some implementations, wherein the first distance is not equal to the second distance.

In some implementations, wherein a direction of a line determined by the first magnetic field sensor and the second magnetic field sensor is (1) approximately parallel to the characteristic direction, or (2) approximately pointing to the moveable apparatus parking place.

For further understanding the characteristics and effects of the present invention, some preferred embodiments referred to drawings are in detail described as follows.

DETAILED DESCRIPTIONS OF PREFERRED EMBODIMENTS

Figure 1A:
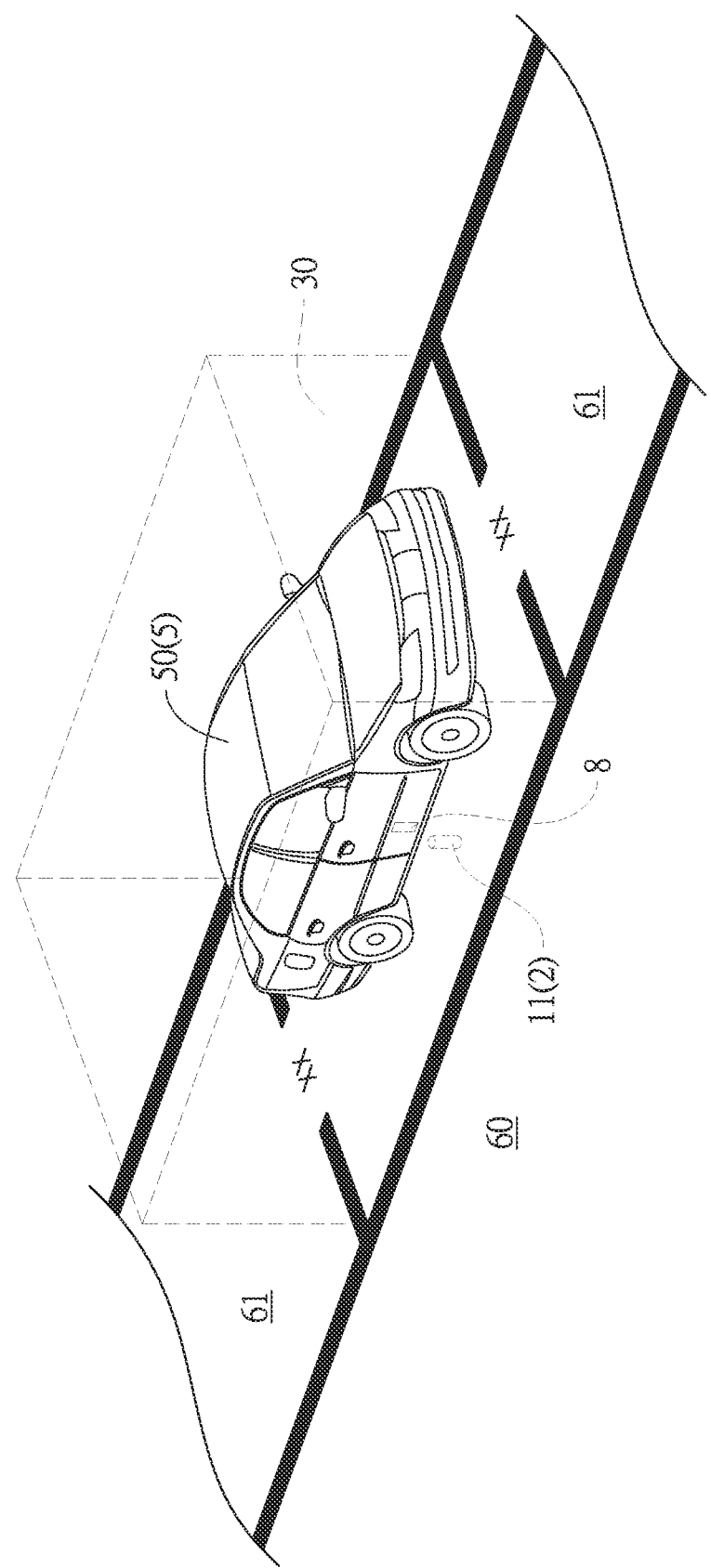
FIGS. 1A and 1B are the schematic perspective view and the cross-sectional schematic view showing an embodiment of system and method for parking detection and identification of moveable apparatus of the present invention.
Figure 1C:
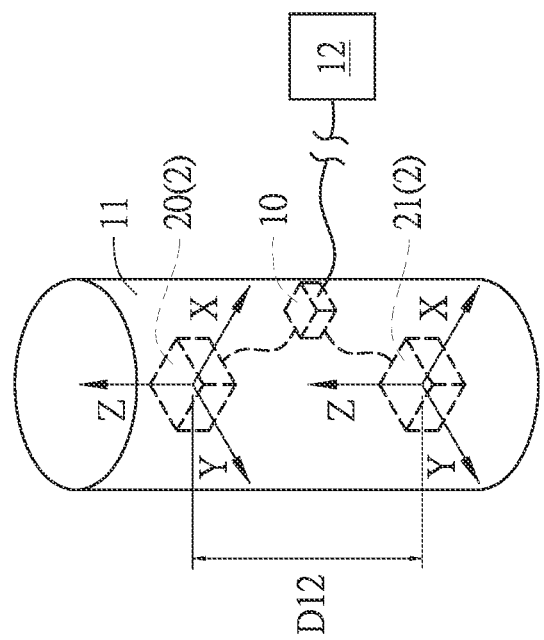
FIG. 1C is the schematic perspective view of the detecting module of FIGS. 1A and 1B.
Figure 1B:
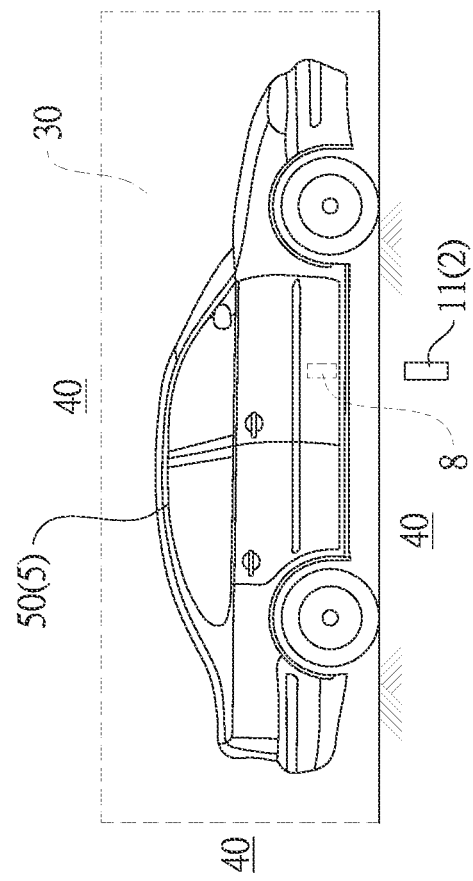
Figure 1E:
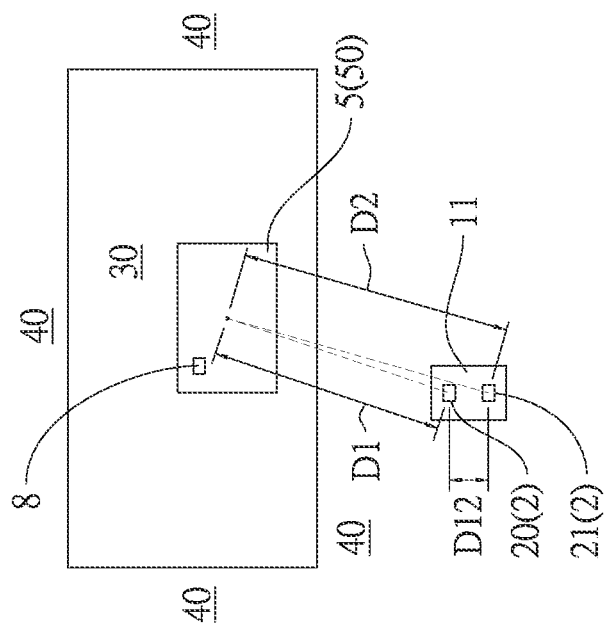
FIGS. 1D and 1E are the cross-sectional schematic views showing the states of the moveable apparatus before entering and after entering the moveable apparatus parking place.
Figure 1D:
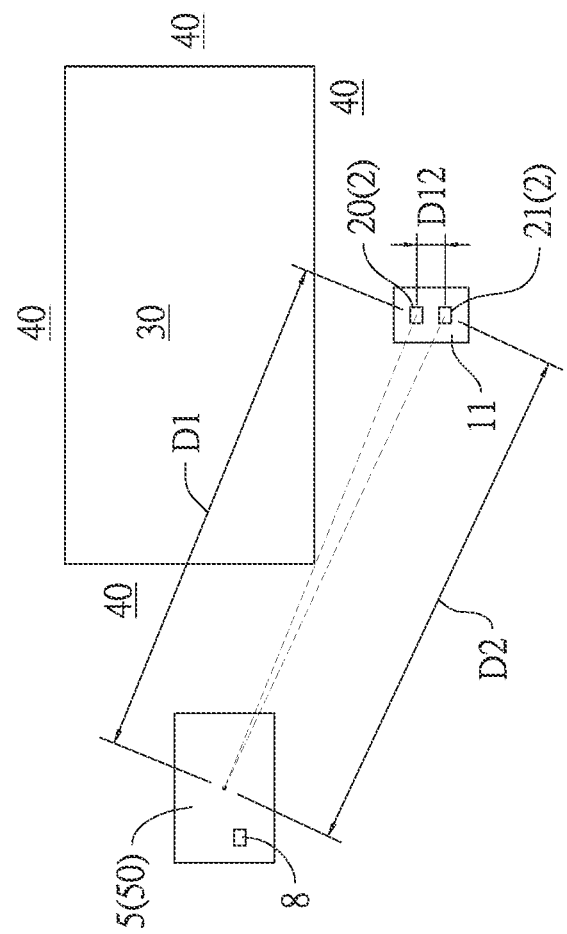

Please refer to FIGS. 1A and 1B, which are the schematic perspective view and the cross-sectional schematic view showing an embodiment of system and method for parking detection and identification of moveable apparatus of the present invention. Please also refer to FIG. 1C, which is the schematic perspective view of the detecting module of FIGS. 1A and 1B. The system for parking detection and identification of moveable apparatus of the present invention comprises a magnetic field sensing apparatus 2, a data processing unit 10 and a magnetic field generator 8. In current embodiment, the moveable apparatus parking place 30 is a parking grid (other parking grids 61 are located before and after the parking grid; a road 60 is beside the parking grid); a moveable apparatus 5 is a vehicle 50; the magnetic field generator 8 is disposed in the moveable apparatus 5 (vehicle 50); the magnetic field sensing apparatus 2 and the data processing unit 10 are both disposed in a detecting module 11, wherein the detecting module 11 (including the magnetic field sensing apparatus 2 and the data processing unit 10) is disposed in a peripheral area 40 of a moveable apparatus parking place 30 (i.e. the detecting module 11 is disposed under the ground of the parking grid; in general, the peripheral area 40 may be any location of the above, the under, and the surrounding of the moveable apparatus parking place 30); the magnetic field sensing apparatus 2 comprises a first magnetic field sensor 20 and a second magnetic field sensor 21. In current embodiment, the magnetic field sensing apparatus 2 (including the first magnetic field sensor 20 and the second magnetic field sensor 21) is connected to the data processing unit 10 in a wired manner; the data processing unit 10 is connected to a server 12 in a wired manner. The second magnetic field sensor 21 is disposed under the first magnetic field sensor 20. A first distance between the first magnetic field sensor 20 and the moveable apparatus parking place 30 is smaller than a second distance between the second magnetic field sensor 21 and moveable apparatus parking place 30 (because the second magnetic field sensor 21 is disposed under the first magnetic field sensor 20); the distance between the first magnetic field sensor 20 and the second magnetic field sensor 21 is a sensor relative distance D12: the first distance between the first magnetic field sensor 20 and the moveable apparatus parking place 30 is greater than the sensor relative distance D12 between the first magnetic field sensor 20 and the second magnetic field sensor 21; the second distance between the second magnetic field sensor 21 and moveable apparatus parking place 30 is greater than the sensor relative distance D12 between the first magnetic field sensor 20 and the second magnetic field sensor 21; wherein a Z-axis direction of the first magnetic field sensor 20 is upward; and a Z-axis direction of the second magnetic field sensor 21 is also upward. Please also refer to FIGS. 1D and 1E, which are the cross-sectional schematic views showing the states of the moveable apparatus before entering and after entering the moveable apparatus parking place. The distance between the moveable apparatus 5 (vehicle 50) and the first magnetic field sensor 20 is a first object distance D1. The distance between the moveable apparatus 5 (vehicle 50) and the second magnetic field sensor 21 is a second object distance D2. The difference of the first object distance D1 and the second object distance D2 is a distance-difference, wherein the absolute value of the distance-difference is less than or equal to the sensor relative distance D12. In FIG. 1D, when the moveable apparatus 5 (vehicle 50) enters the peripheral area 40 of the moveable apparatus parking place 30 (before entering the moveable apparatus parking place 30), a variation of magnetic field is induced by the moveable apparatus 5 (vehicle 50). The first object distance D1 is much larger than the sensor relative distance D12 (also much larger than the distance-difference); the second object distance D2 is much larger than the sensor relative distance D12 (also much larger than the distance-difference). Hence, for both the first magnetic field sensor 20 and the second magnetic field sensor 21, the variation of magnetic field induced by the moveable apparatus 5 (vehicle 50) belongs to a long distance magnetic field variation. Therefore, the variation of magnetic field (induced by the moveable apparatus 5) measured by the first magnetic field sensor 20 is very close to the variation of magnetic field (induced by the moveable apparatus 5) measured by the second magnetic field sensor 21 (almost the same). In FIG. 1E, when the moveable apparatus 5 (vehicle 50) enters the moveable apparatus parking place 30, then the first object distance D1 is not much larger than the sensor relative distance D12 (also not much larger than the distance-difference): the second object distance D2 is not much larger than the sensor relative distance D12 (also not much larger than the distance-difference). That is that for both the first object distance D1 and the second object distance D2, the sensor relative distance D12 and the distance-difference are not negligible. Therefore, for both the first magnetic field sensor 20 and the second magnetic field sensor 21, the variation of magnetic field induced by the moveable apparatus 5 belongs to a short distance magnetic field variation (a near magnetic field variation). Hence, the variation of magnetic field (induced by the moveable apparatus 5) measured by the first magnetic field sensor 20 is not nearly the same as the variation of magnetic field (induced by the moveable apparatus 5) measured by the second magnetic field sensor 21. The method for parking detection and identification of moveable apparatus of the present invention can be roughly divided into three stages: (1) the first stage is the front detection stage: measuring magnetic field by the magnetic field sensing apparatus 2 to detect whether the moveable apparatus 5 (vehicle 50) has entered the moveable apparatus parking place 30 (i.e. whether a first near magnetic field variation has occurred); (2) the second stage is the middle identification stage: generating a magnetic field signal by the magnetic field generator 8 of the moveable apparatus 5 (vehicle 50) and measuring magnetic field by the magnetic field sensing apparatus 2 to obtain the unique identifier for identifying the moveable apparatus 5 (vehicle 50): and (3) the third stage is the rear detection stage: stopping generating the magnetic field signal by the magnetic field generator 8 and measuring magnetic field by the magnetic field sensing apparatus 2 to detect whether the moveable apparatus 5 (vehicle 50) has left the moveable apparatus parking place 30 (i.e. whether a second near magnetic field variation has occurred). In current embodiment, the method for parking detection and identification of moveable apparatus of the present invention comprises following steps of: Step A1 (the front detection stage): measuring magnetic field by the first magnetic field sensor 20 and the second magnetic field sensor 21 of the magnetic field sensing apparatus 2 respectively, wherein the magnetic field sensing apparatus 2 is disposed in the peripheral area 40 of the moveable apparatus parking place 30, wherein a front stage first magnetic field measurement (the magnetic field measurement measured by the first magnetic field sensor 20 during the front detection stage) and a front stage second magnetic field measurement (the magnetic field measurement measured by the second magnetic field sensor 21 during the front detection stage) are measured by the first magnetic field sensor 20 and the second magnetic field sensor 21 respectively; Step A2 (the front detection stage): calculating a front stage magnetic field measurement difference by the data processing unit 10, wherein the front stage magnetic field measurement difference is (1) a magnitude of a difference of the front stage first magnetic field measurement and the front stage second magnetic field measurement, or (2) a magnitude of a difference of a front stage first magnetic field component of the front stage first magnetic field measurement along a characteristic direction (for example the Z-axis direction) and a front stage second magnetic field component of the front stage second magnetic field measurement along the characteristic direction, wherein a first near magnetic field variation is occurred when (a) the front stage magnetic field measurement difference is continuously greater than a first characteristic threshold within a first characteristic time period, or (b) an average value of the front stage magnetic field measurement difference is greater than a first characteristic average threshold within a first characteristic average time period, wherein the first near magnetic field variation is occurred since the moveable apparatus 5 (vehicle 50) enters the moveable apparatus parking place 30; Step A3 (the middle identification stage): generating a magnetic field signal by the magnetic field generator 8 disposed in the moveable apparatus 5 (vehicle 50), wherein the magnetic field signal contains an unique identifier for identifying the moveable apparatus 5 (vehicle 50); Step A4 (the middle identification stage): measuring magnetic field by the first magnetic field sensor 20 and the second magnetic field sensor 21 of the magnetic field sensing apparatus 2 respectively, wherein a first magnetic field measurement (the magnetic field measurement measured by the first magnetic field sensor 20 during the middle identification stage) and a second magnetic field measurement (the magnetic field measurement measured by the second magnetic field sensor 21 during the middle identification stage) are measured by the first magnetic field sensor 20 and the second magnetic field sensor 21 respectively: and Step A5 (the middle identification stage): calculating a magnetic field measurement difference by the data processing unit 10 to obtain the unique identifier for identifying the moveable apparatus 5 (vehicle 50) from the magnetic field measurement difference, wherein the magnetic field measurement difference is (1) a magnitude of a difference of the first magnetic field measurement and the second magnetic field measurement, or (2) a magnitude of a difference of a first magnetic field component of the first magnetic field measurement along the characteristic direction (for example the Z-axis direction) and a second magnetic field component of the second magnetic field measurement along the characteristic direction. Therefore, by subtracting the magnetic field measurements (or subtracting the magnetic field components of the magnetic field measurements along the characteristic direction) measured by the first magnetic field sensor 20 and the second magnetic field sensor 21, the system and method for parking detection and identification of moveable apparatus of the present invention can remove the influence of the long distance magnetic field variation to determine whether a near magnetic field variation is occurred. The influence of the long distance magnetic field variation includes the influence of the geomagnetic field variation in the same place over time. The influence of the geomagnetic field variation in the same place over time has also been removed. Hence, the system and method for parking detection and identification of moveable apparatus of the present invention indeed can achieve that to use the magnetic field sensing apparatus 2 to detect if the moveable apparatus 5 (vehicle 50) enters the moveable apparatus parking place 30 (parking grid) and to use the same magnetic field sensing apparatus 2 to identification the moveable apparatus 5 (vehicle 50).

In some embodiments, after the Step A5, the method for parking detection and identification of moveable apparatus of the present invention further comprises following steps of (the rear detection stage): Step A6: stopping generating the magnetic field signal by the magnetic field generator 8: Step A7: measuring magnetic field by the first magnetic field sensor 20 and the second magnetic field sensor 21 of the magnetic field sensing apparatus 2 respectively, wherein a rear stage first magnetic field measurement (the magnetic field measurement measured by the first magnetic field sensor 20 during the rear detection stage) and a rear stage second magnetic field measurement (the magnetic field measurement measured by the second magnetic field sensor 21 during the rear detection stage) are measured by the first magnetic field sensor 20 and the second magnetic field sensor 21 respectively; and Step A8: calculating a rear stage magnetic field measurement difference by the data processing unit 10, wherein the rear stage magnetic field measurement difference is (1) a magnitude of a difference of the rear stage first magnetic field measurement and the rear stage second magnetic field measurement, or (2) a magnitude of a difference of a rear stage first magnetic field component of the rear stage first magnetic field measurement along the characteristic direction (for example the Z-axis direction) and a rear stage second magnetic field component of the rear stage second magnetic field measurement along the characteristic direction, wherein a second near magnetic field variation is occurred when (a) the rear stage magnetic field measurement difference is continuously smaller than a second characteristic threshold within a second characteristic time period, or (b) an average value of the rear stage magnetic field measurement difference is smaller than a second characteristic average threshold within a second characteristic average time period, wherein the second near magnetic field variation is occurred since the moveable apparatus 5 (vehicle 50) leaves the moveable apparatus parking place 30.

In some embodiments, the magnetic field sensing apparatus 2 may continue measuring magnetic field during the front detection stage, the middle identification stage, and the rear detection stage.

In some embodiments, in the Step A2, the front stage magnetic field measurement difference is the magnitude of the difference of the front stage first magnetic field measurement and the front stage second magnetic field measurement; the first near magnetic field variation is occurred when the front stage magnetic field measurement difference is continuously greater than the first characteristic threshold within the first characteristic time period: in the Step A8, the rear stage magnetic field measurement difference is the magnitude of the difference of the rear stage first magnetic field measurement and the rear stage second magnetic field measurement; the second near magnetic field variation is occurred when the rear stage magnetic field measurement difference is continuously smaller than the second characteristic threshold within the second characteristic time period. In some embodiments, in the Step A2, the front stage magnetic field measurement difference is the magnitude of the difference of the front stage first magnetic field measurement and the front stage second magnetic field measurement: the first near magnetic field variation is occurred when the average value of the front stage magnetic field measurement difference is greater than the first characteristic average threshold within the first characteristic average time period; in the Step A8, the rear stage magnetic field measurement difference is the magnitude of the difference of the rear stage first magnetic field measurement and the rear stage second magnetic field measurement; the second near magnetic field variation is occurred when the average value of the rear stage magnetic field measurement difference is smaller than the second characteristic average threshold within the second characteristic average time period. In some embodiments, in the Step A2, the front stage magnetic field measurement difference is the magnitude of the difference of the front stage first magnetic field component of the front stage first magnetic field measurement along the characteristic direction (for example the Z-axis direction) and the front stage second magnetic field component of the front stage second magnetic field measurement along the characteristic direction; the first near magnetic field variation is occurred when the front stage magnetic field measurement difference is continuously greater than the first characteristic threshold within the first characteristic time period; in the Step A8, the rear stage magnetic field measurement difference is the magnitude of the difference of the rear stage first magnetic field component of the rear stage first magnetic field measurement along the characteristic direction (for example the Z-axis direction) and the rear stage second magnetic field component of the rear stage second magnetic field measurement along the characteristic direction: the second near magnetic field variation is occurred when the rear stage magnetic field measurement difference is continuously smaller than the second characteristic threshold within the second characteristic time period. In some embodiments, in the Step A2, the front stage magnetic field measurement difference is the magnitude of the difference of the front stage first magnetic field component of the front stage first magnetic field measurement along the characteristic direction (for example the Z-axis direction) and the front stage second magnetic field component of the front stage second magnetic field measurement along the characteristic direction: the first near magnetic field variation is occurred when the average value of the front stage magnetic field measurement difference is greater than the first characteristic average threshold within the first characteristic average time period: in the Step A8, the rear stage magnetic field measurement difference is the magnitude of the difference of the rear stage first magnetic field component of the rear stage first magnetic field measurement along the characteristic direction (for example the Z-axis direction) and the rear stage second magnetic field component of the rear stage second magnetic field measurement along the characteristic direction: the second near magnetic field variation is occurred when the average value of the rear stage magnetic field measurement difference is smaller than the second characteristic average threshold within the second characteristic average time period.

In some embodiments, the Step A4 and the Step A5 can be replaced by Step A4' and Step A5', respectively, wherein the Step A4' (the middle identification stage): measuring magnetic field by one of the first magnetic field sensor 20 and the second magnetic field sensor 21, wherein a magnetic field measurement is measured; the Step A5' (the middle identification stage): obtaining the unique identifier for identifying the moveable apparatus 5 (vehicle 50) by the data processing unit 10 from (1) the magnetic field measurement, or (2) a magnetic field component of the magnetic field measurement along the characteristic direction (for example the Z-axis direction).

The server 12 may collect the information of the moveable apparatus 5 (vehicle 50), wherein the information may include (1) the unique identifier of the moveable apparatus 5 (vehicle 50). (2) the time the moveable apparatus 5 (vehicle 50) entered the moveable apparatus parking place 30 (parking grid), and (3) the time the moveable apparatus 5 (vehicle 50) left the moveable apparatus parking place 30 (parking grid). The server 12 may also collect the result calculated by the data processing unit 10 and the data measured by the first magnetic field sensor 20 and the second magnetic field sensor 21, respectively.

In some embodiments, the magnetic field generator 8 may have a rechargeable battery (not shown in Figure). The magnetic field generator 8 may be designed having the mechanism as follows: (1) when the moveable apparatus 5 (vehicle 50) is turned on, the rechargeable battery of the magnetic field generator 8 is connected to a battery of the moveable apparatus 5 (vehicle 50) or the electric system of the moveable apparatus 5 (vehicle 50), so that the rechargeable battery of the magnetic field generator 8 can be charged, and (2) when the moveable apparatus 5 (vehicle 50) is turned off, the magnetic field generator 8 starts generating a magnetic field signal, and the rechargeable battery of the magnetic field generator 8 is disconnected from the battery of the moveable apparatus 5 (vehicle 50) or the electric system of the moveable apparatus 5 (vehicle 50), so that the rechargeable battery of the magnetic field generator 8 cannot be charged. Hence the magnetic field generator 8 will stop generating the magnetic field signal when the rechargeable battery of the magnetic field generator 8 is out of battery. The rechargeable battery of the magnetic field generator 8 may be designed having smaller battery capacity. For example, after the magnetic field generator 8 starts generating the magnetic field signal for 5 minutes, the rechargeable battery of the magnetic field generator 8 will be out of battery. Therefore, when the moveable apparatus 5 (vehicle 50) enters the moveable apparatus parking place 30, the system and method for parking detection and identification of moveable apparatus of the present invention detects the first near magnetic field variation (the Step A2). When the moveable apparatus 5 (vehicle 50) is turned off, the magnetic field generator 8 starts generating a magnetic field signal (the Step A3). Then, in the Step A4, the first magnetic field measurement and the second magnetic field measurement are measured by the first magnetic field sensor 20 and the second magnetic field sensor 21 respectively. In the Step A5, the unique identifier for identifying the moveable apparatus 5 (vehicle 50) is obtained from the magnetic field measurement difference. Then, after the magnetic field generator 8 generates the magnetic field signal for 5 minutes, the rechargeable battery of the magnetic field generator 8 is out of battery, so that the magnetic field generator 8 stops generating the magnetic field signal (the Step A6). After that, the first magnetic field sensor 20 and the second magnetic field sensor 21 continue measuring magnetic field respectively (Step A7). The second near magnetic field variation is detected when the moveable apparatus 5 (vehicle 50) leaves the moveable apparatus parking place 30 (the Step A8).

Figure 1F:
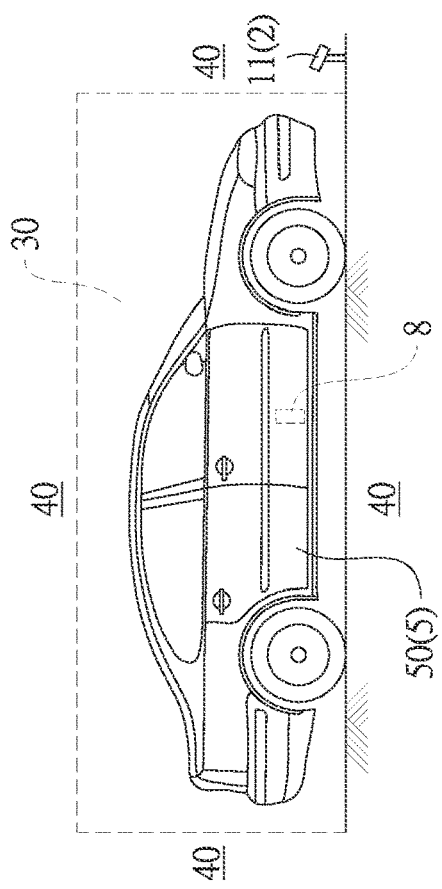
FIGS. 1F~1K are cross-sectional schematic views of embodiments of the location of the detecting module of system and method for parking detection and identification of moveable apparatus of the present invention.
Figure 1G:
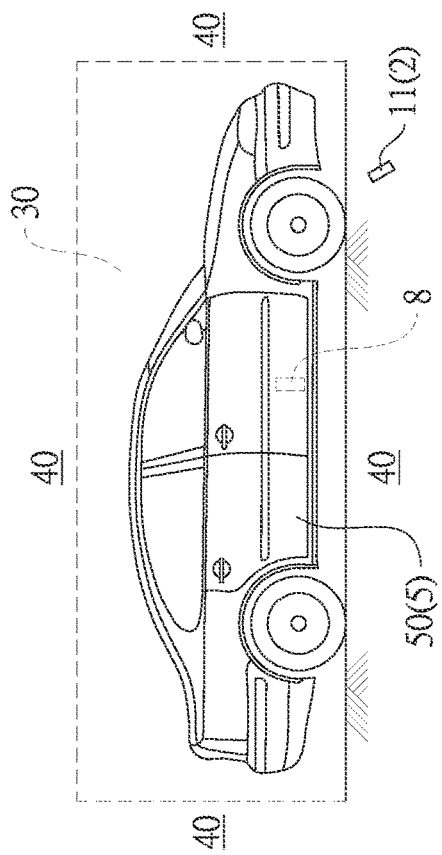
Figure 1I:
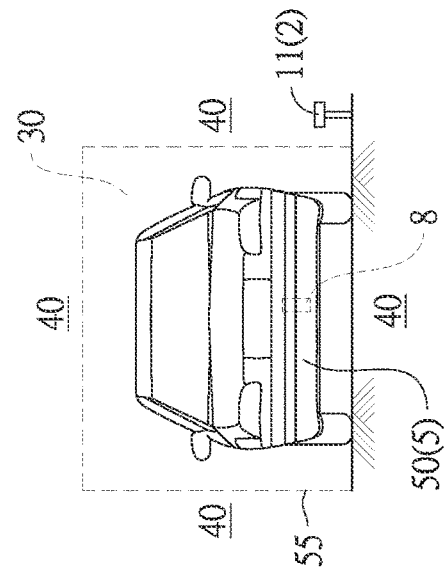
Figure 1H:
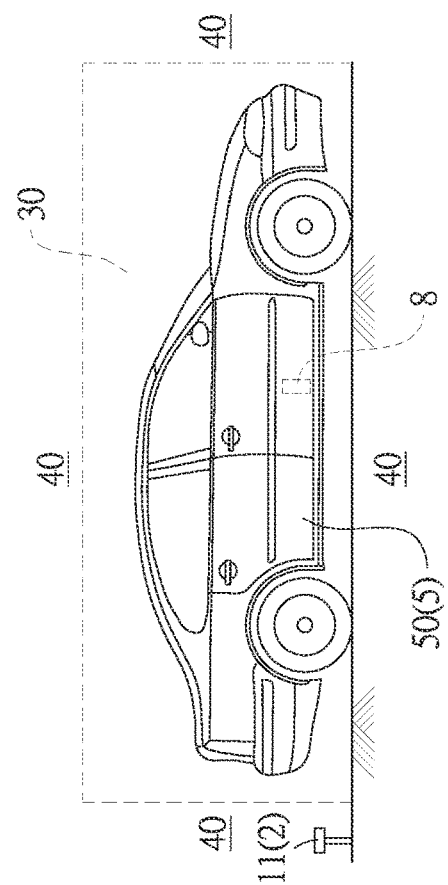
Figure 1K:
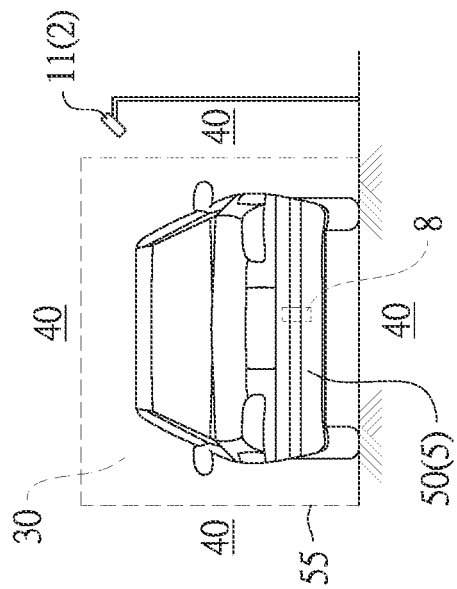
Figure 1J:
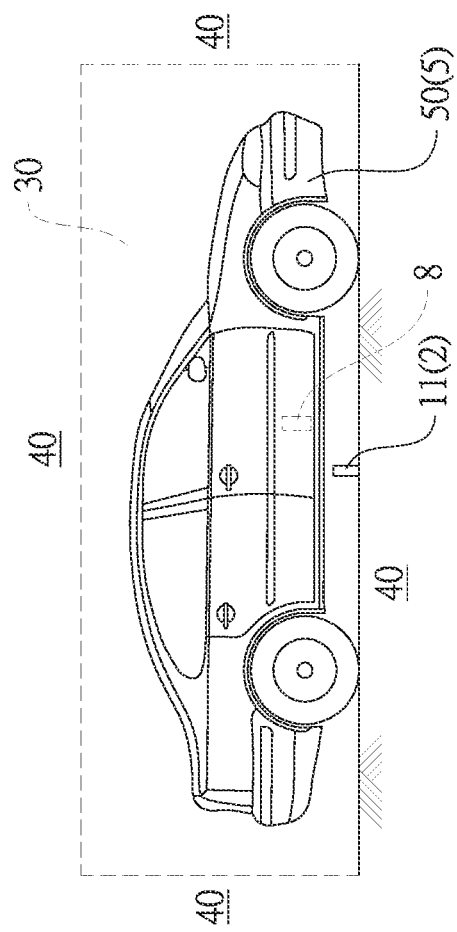

Please refer to FIGS. 1F~1K, which are cross-sectional schematic views of embodiments of the location of the detecting module of system and method for parking detection and identification of moveable apparatus of the present invention. In the embodiment of FIG. 1F, the detecting module 11 (including the magnetic field sensing apparatus 2) is disposed under the ground (belonging to the peripheral area 40) of the moveable apparatus parking place 30 (parking grid), wherein the direction of the line determined by the first magnetic field sensor 20 and the second magnetic field sensor 21 is approximately pointing to the moveable apparatus parking place 30 (parking grid). In the embodiment of FIG. 1G, the detecting module 11 (including the magnetic field sensing apparatus 2) is disposed above the ground on the front side (belonging to the peripheral area 40) of the moveable apparatus parking place 30 (parking grid), wherein the direction of the line determined by the first magnetic field sensor 20 and the second magnetic field sensor 21 is approximately pointing to the moveable apparatus parking place 30 (parking grid). In the embodiment of FIG. 1H, the detecting module 11 (including the magnetic field sensing apparatus 2) is disposed above the ground on the rear side (belonging to the peripheral area 40) of the moveable apparatus parking place 30 (parking grid), wherein the direction of the line determined by the first magnetic field sensor 20 and the second magnetic field sensor 21 is approximately pointing to the moveable apparatus parking place 30 (parking grid). In the embodiment of FIG. 1I, the detecting module 11 (including the magnetic field sensing apparatus 2) is disposed above the ground on one side (belonging to the peripheral area 40) of the moveable apparatus parking place 30 (parking grid), wherein the direction of the line determined by the first magnetic field sensor 20 and the second magnetic field sensor 21 is approximately pointing to the moveable apparatus parking place 30 (parking grid). The detecting module 11 (including the magnetic field sensing apparatus 2) is better not disposed near an entrance 55. In the embodiment of FIG. 1J, the detecting module 11 (including the magnetic field sensing apparatus 2) is disposed above the ground (belonging to the moveable apparatus parking place 30) of the moveable apparatus parking place 30 (parking grid), wherein the direction of the line determined by the first magnetic field sensor 20 and the second magnetic field sensor 21 is approximately pointing to the moveable apparatus parking place 30 (parking grid). In the embodiment of FIG. 1K, the detecting module 11 (including the magnetic field sensing apparatus 2) is disposed on the top of one side (belonging to the peripheral area 40) of the moveable apparatus parking place 30 (parking grid), wherein the direction of the line determined by the first magnetic field sensor 20 and the second magnetic field sensor 21 is approximately pointing to the moveable apparatus parking place 30 (parking grid). The detecting module 11 (including the magnetic field sensing apparatus 2) is better not disposed near the entrance 55.

Figure 2A:
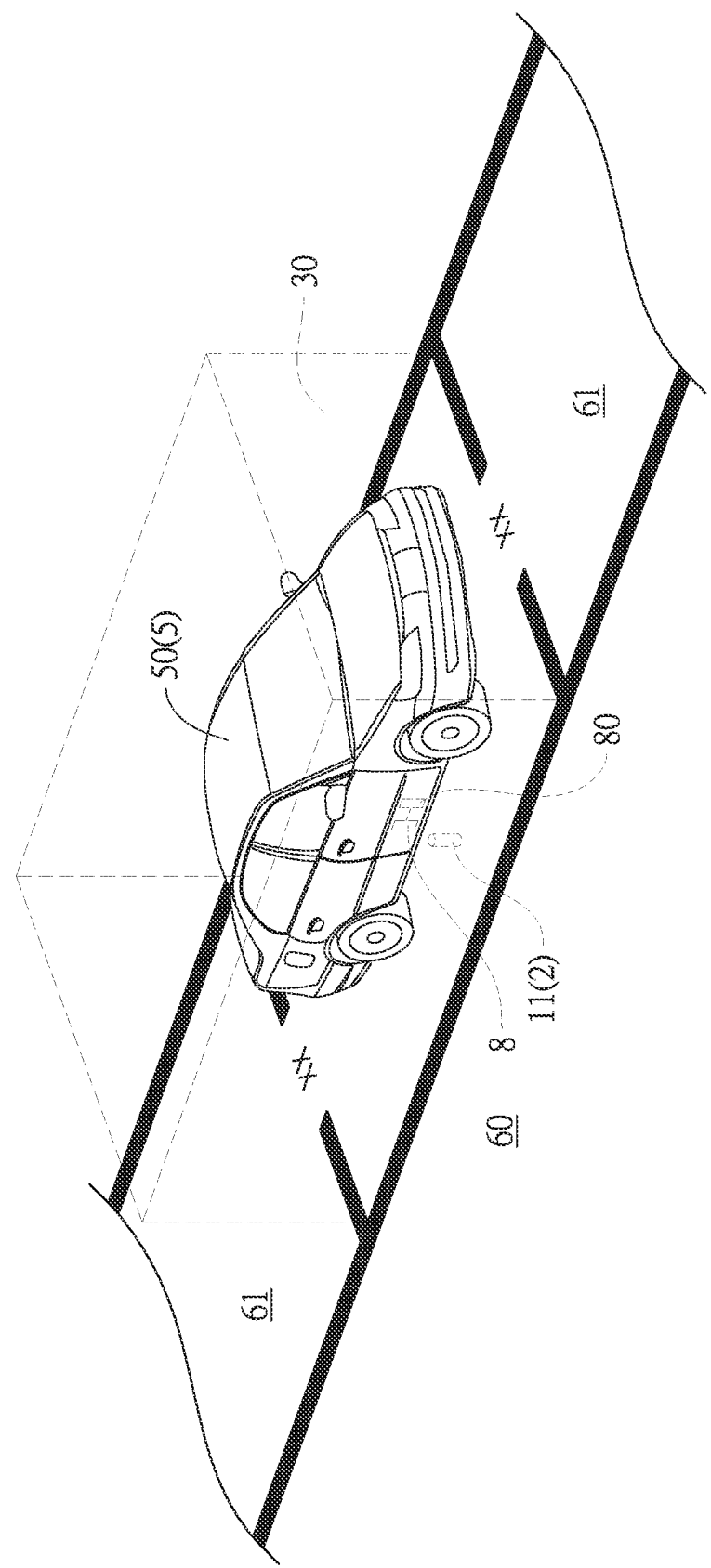
FIGS. 2A and 2B are the schematic perspective view and the cross-sectional schematic view showing another embodiment of system and method for parking detection and identification of moveable apparatus of the present invention.
Figure 2C:
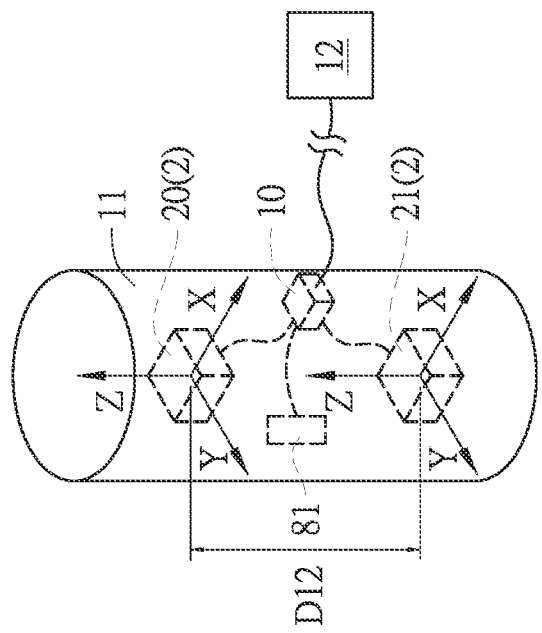
FIG. 2C is the schematic perspective view of the detecting module of FIGS. 2A and 2B.
Figure 2B:
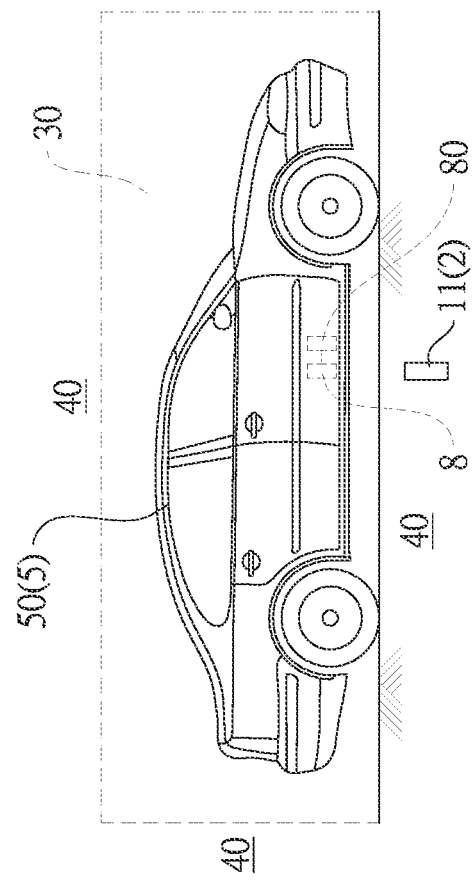

Please refer to FIGS. 2A and 2B, which are the schematic perspective view and the cross-sectional schematic view showing another embodiment of system and method for parking detection and identification of moveable apparatus of the present invention. Please also refer to FIG. 2C, which is the schematic perspective view of the detecting module of FIGS. 2A and 2B. The system for parking detection and identification of moveable apparatus of the present invention comprises a magnetic field sensing apparatus 2, a data processing unit 10, a magnetic field generator 8, a receiver 80 and a transmitter 81. In current embodiment, the moveable apparatus parking place 30 is a parking grid (other parking grids 61 are located before and after the parking grid: a road 60 is beside the parking grid); a moveable apparatus 5 is a vehicle 50; the magnetic field generator 8 and the receiver 80 are disposed in the moveable apparatus 5 (vehicle 50), wherein the receiver 80 is connected to the magnetic field generator 8 in a wired manner: the magnetic field sensing apparatus 2, the data processing unit 10 and the transmitter 81 are disposed in a detecting module 11, wherein the detecting module 11 (including the magnetic field sensing apparatus 2, the data processing unit 10 and the transmitter 81) is disposed in a peripheral area 40 of a moveable apparatus parking place 30 (i.e. the detecting module 11 is disposed under the ground of the parking grid; in general, the peripheral area 40 may be any location of the above, the under, and the surrounding of the moveable apparatus parking place 30); the magnetic field sensing apparatus 2 comprises a first magnetic field sensor 20 and a second magnetic field sensor 21. In current embodiment, the magnetic field sensing apparatus 2 (including the first magnetic field sensor 20 and the second magnetic field sensor 21) is connected to the data processing unit 10 in a wired manner; the transmitter 81 is also connected to the data processing unit 10 in a wired manner: the data processing unit 10 is connected to a server 12 in a wired manner. The second magnetic field sensor 21 is disposed under the first magnetic field sensor 20. A first distance between the first magnetic field sensor 20 and the moveable apparatus parking place 30 is smaller than a second distance between the second magnetic field sensor 21 and moveable apparatus parking place 30 (because the second magnetic field sensor 21 is disposed under the first magnetic field sensor 20): the first distance between the first magnetic field sensor 20 and the moveable apparatus parking place 30 is greater than a sensor relative distance D12 between the first magnetic field sensor 20 and the second magnetic field sensor 21; the second distance between the second magnetic field sensor 21 and moveable apparatus parking place 30 is greater than the sensor relative distance D12 between the first magnetic field sensor 20 and the second magnetic field sensor 21; wherein a Z-axis direction of the first magnetic field sensor 20 is upward; and a Z-axis direction of the second magnetic field sensor 21 is upward. In current embodiment, the method for parking detection and identification of moveable apparatus of the present invention comprises following steps of: Step A1 (the front detection stage); measuring magnetic field by the first magnetic field sensor 20 and the second magnetic field sensor 21 of the magnetic field sensing apparatus 2 respectively, wherein the magnetic field sensing apparatus 2 is disposed in the peripheral area 40 of the moveable apparatus parking place 30, wherein a front stage first magnetic field measurement (the magnetic field measurement measured by the first magnetic field sensor 20 during the front detection stage) and a front stage second magnetic field measurement (the magnetic field measurement measured by the second magnetic field sensor 21 during the front detection stage) are measured by the first magnetic field sensor 20 and the second magnetic field sensor 21 respectively; Step A2 (the front detection stage): calculating a front stage magnetic field measurement difference by the data processing unit 10, wherein the front stage magnetic field measurement difference is (1) a magnitude of a difference of the front stage first magnetic field measurement and the front stage second magnetic field measurement, or (2) a magnitude of a difference of a front stage first magnetic field component of the front stage first magnetic field measurement along a characteristic direction (for example the Z-axis direction) and a front stage second magnetic field component of the front stage second magnetic field measurement along the characteristic direction, wherein a first near magnetic field variation is occurred when (a) the front stage magnetic field measurement difference is continuously greater than a first characteristic threshold within a first characteristic time period, or (b) an average value of the front stage magnetic field measurement difference is greater than a first characteristic average threshold within a first characteristic average time period, wherein the first near magnetic field variation is occurred since the moveable apparatus 5 (vehicle 50) enters the moveable apparatus parking place 30; Step A21 (the middle identification stage): emitting a starting signal by the transmitter 81; Step A22 (the middle identification stage): receiving the starting signal by the receiver 80 disposed in the moveable apparatus 5 (vehicle 50): Step A3 (the middle identification stage): generating a magnetic field signal by the magnetic field generator 8 disposed in the moveable apparatus 5 (vehicle 50), wherein the magnetic field generator 8 is activated by the starting signal to start generating the magnetic field signal, wherein the magnetic field signal contains an unique identifier for identifying the moveable apparatus 5 (vehicle 50); Step A4 (the middle identification stage): measuring magnetic field by the first magnetic field sensor 20 and the second magnetic field sensor 21 of the magnetic field sensing apparatus 2 respectively, wherein a first magnetic field measurement (the magnetic field measurement measured by the first magnetic field sensor 20 during the middle identification stage) and a second magnetic field measurement (the magnetic field measurement measured by the second magnetic field sensor 21 during the middle identification stage) are measured by the first magnetic field sensor 20 and the second magnetic field sensor 21 respectively; and Step A5 (the middle identification stage): calculating a magnetic field measurement difference by the data processing unit 10 to obtain the unique identifier for identifying the moveable apparatus 5 (vehicle 50) from the magnetic field measurement difference, wherein the magnetic field measurement difference is (1) a magnitude of a difference of the first magnetic field measurement and the second magnetic field measurement, or (2) a magnitude of a difference of a first magnetic field component of the first magnetic field measurement along a characteristic direction (for example the Z-axis direction) and a second magnetic field component of the second magnetic field measurement along the characteristic direction. Therefore, by subtracting the magnetic field measurements (or subtracting the magnetic field components of the magnetic field measurements along the characteristic direction) measured by the first magnetic field sensor 20 and the second magnetic field sensor 21, the system and method for parking detection and identification of moveable apparatus of the present invention can remove the influence of the long distance magnetic field variation to determine whether a near magnetic field variation is occurred. The influence of the long distance magnetic field variation includes the influence of the geomagnetic field variation in the same place over time. The influence of the geomagnetic field variation in the same place over time has also been removed. Hence, the system and method for parking detection and identification of moveable apparatus of the present invention indeed can achieve that to use the magnetic field sensing apparatus 2 to detect if the moveable apparatus 5 (vehicle 50) enters the moveable apparatus parking place 30 (parking grid) and to use the same magnetic field sensing apparatus 2 to identification the moveable apparatus 5 (vehicle 50). In some embodiments, the signal emitted by the starting signal by the transmitter 81 is an electromagnetic signal, wherein the receiver 80 can receive the electromagnetic signal. In some embodiments, the signal emitted by the starting signal by the transmitter 81 is an optical signal, wherein the receiver 80 can receive the optical signal. In some embodiments, the signal emitted by the starting signal by the transmitter 81 is a kind of magnetic signal, wherein the receiver 80 can receive the magnetic signal emitted by the transmitter 81.

In some embodiments, after the Step A5, the method for parking detection and identification of moveable apparatus of the present invention further comprises following steps of (the rear detection stage): Step A6: stopping generating the magnetic field signal by the magnetic field generator 8, wherein the Step A6 comprises following steps of: Step A61: emitting a terminating signal by the transmitter 81; and Step A62: receiving the terminating signal by the receiver 80, wherein the magnetic field generator 8 is stopped generating the magnetic field signal by the terminating signal; Step A7: measuring magnetic field by the first magnetic field sensor 20 and the second magnetic field sensor 21 of the magnetic field sensing apparatus 2 respectively, wherein a rear stage first magnetic field measurement (the magnetic field measurement measured by the first magnetic field sensor 20 during the rear detection stage) and a rear stage second magnetic field measurement (the magnetic field measurement measured by the second magnetic field sensor 21 during the rear detection stage) are measured by the first magnetic field sensor 20 and the second magnetic field sensor 21 respectively; and Step A8: calculating a rear stage magnetic field measurement difference by the data processing unit 10, wherein the rear stage magnetic field measurement difference is (1) a magnitude of a difference of the rear stage first magnetic field measurement and the rear stage second magnetic field measurement, or (2) a magnitude of a difference of a rear stage first magnetic field component of the rear stage first magnetic field measurement along the characteristic direction (for example the Z-axis direction) and a rear stage second magnetic field component of the rear stage second magnetic field measurement along the characteristic direction, wherein a second near magnetic field variation is occurred when (a) the rear stage magnetic field measurement difference is continuously smaller than a second characteristic threshold within a second characteristic time period, or (b) an average value of the rear stage magnetic field measurement difference is smaller than a second characteristic average threshold within a second characteristic average time period, wherein the second near magnetic field variation is occurred since the moveable apparatus 5 (vehicle 50) leaves the moveable apparatus parking place 30.

In some embodiments, in the Step A3 or the Step A3', the unique identifier is Morse-code encoded; in the Step A5, the unique identifier is obtained from the magnetic field measurement difference via Morse-code decoding.

In some embodiments, in the Step A3 or the Step A3, the unique identifier is Morse-code encoded: in the Step A5', the unique identifier is obtained from (1) the magnetic field measurement, or (2) a magnetic field component of the magnetic field measurement along the characteristic direction (for example the Z-axis direction) via Morse-code decoding.

In some embodiments, in the Step A3 or the Step A3', the unique identifier is encrypted and then Morse-code encoded; in the Step A5, the unique identifier is obtained from the magnetic field measurement difference via Morse-code decoding and then decrypting.

In some embodiments, in the Step A3 or the Step A3', the unique identifier is encrypted and then Morse-code encoded; in the Step A5', the unique identifier is obtained from (1) the magnetic field measurement, or (2) a magnetic field component of the magnetic field measurement along the characteristic direction (for example the Z-axis direction) via Morse-code decoding and then decrypting.

Figure 3:
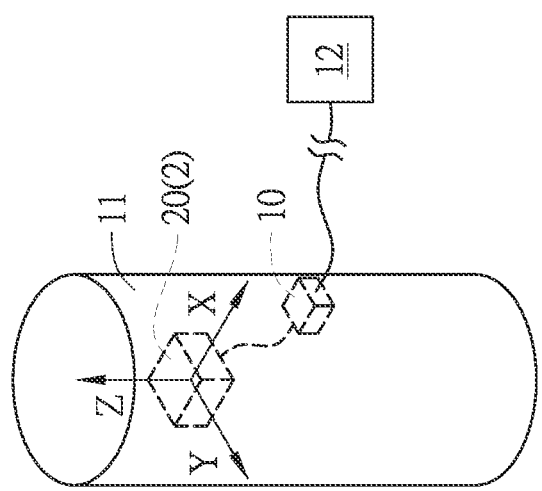
FIG. 3 is the schematic perspective view of an embodiment of the detecting module of system and method for parking detection and identification of moveable apparatus of the present invention.

Please refer to FIGS. 1A, 1B, 1C and 3, wherein FIG. 3 is the schematic perspective view of an embodiment of the detecting module of system and method for parking detection and identification of moveable apparatus of the present invention. The main structure of the embodiment of FIG. 3 is basically the same as the structure of the embodiment of FIG. 1C, except that the magnetic field sensing apparatus 2 comprises a first magnetic field sensor 20 (there is no such a second magnetic field sensor 21). In the embodiment of FIG. 3, the system for parking detection and identification of moveable apparatus of the present invention comprises the magnetic field sensing apparatus 2, the data processing unit 10 and the magnetic field generator 8. The magnetic field sensing apparatus 2 and the data processing unit 10 are both disposed in the detecting module 11, wherein the detecting module 11 (including the magnetic field sensing apparatus 2 and the data processing unit 10) is disposed in the peripheral area 40 of the moveable apparatus parking place 30 (in general, the peripheral area 40 may be any location of the above, the under, and the surrounding of the moveable apparatus parking place 30). In current embodiment, the moveable apparatus parking place 30 is a parking grid: the moveable apparatus 5 is a vehicle 50; wherein the detecting module 11 (including the magnetic field sensing apparatus 2 and the data processing unit 10) is disposed under the ground of the parking grid. The magnetic field generator 8 is disposed in the moveable apparatus 5 (vehicle 50). The magnetic field sensing apparatus 2 (the first magnetic field sensor 20) is connected to the data processing unit 10 in a wired manner; wherein a Z-axis direction of the first magnetic field sensor 20 is upward; the data processing unit 10 is connected to a server 12 in a wired manner. The method for parking detection and identification of moveable apparatus of the present invention comprises following steps of: Step B1 (the front detection stage): measuring magnetic field by the first magnetic field sensor 20 of the magnetic field sensing apparatus 2, wherein the magnetic field sensing apparatus 2 is disposed in the peripheral area 40 of the moveable apparatus parking place 30, wherein a front stage magnetic field measurement is measured by the first magnetic field sensor 20; Step B2 (the front detection stage): calculating a first near magnetic field variation by the data processing unit 10 from (1) the front stage magnetic field measurement, or (2) a front stage magnetic field component of the front stage magnetic field measurement along a characteristic direction (for example the Z-axis direction), wherein the first near magnetic field variation is occurred since the moveable apparatus 5 (vehicle 50) enters the moveable apparatus parking place 30; Step B3 (the middle identification stage): generating a magnetic field signal by the magnetic field generator 8 disposed in the moveable apparatus 5 (vehicle 50), wherein the magnetic field signal contains an unique identifier for identifying the moveable apparatus 5 (vehicle 50): Step B4 (the middle identification stage): measuring magnetic field by the first magnetic field sensor 20, wherein a magnetic field measurement is measured by the first magnetic field sensor 20: and Step B5 (the middle identification stage): obtaining the unique identifier for identifying the moveable apparatus 5 (vehicle 50) by the data processing unit 10 from (1) the magnetic field measurement, or (2) a magnetic field component of the magnetic field measurement along the characteristic direction (for example the Z-axis direction). Hence, the system and method for parking detection and identification of moveable apparatus of the present invention indeed can achieve that to use the magnetic field sensing apparatus 2 to detect if the moveable apparatus 5 (vehicle 50) enters the moveable apparatus parking place 30 (parking grid) and to use the same magnetic field sensing apparatus 2 to identification the moveable apparatus 5 (vehicle 50).

In some embodiments, after the Step B5, the method for parking detection and identification of moveable apparatus of the present invention further comprises following steps of (the rear detection stage): Step B6: stopping generating the magnetic field signal by the magnetic field generator 8; Step B7: measuring magnetic field by the first magnetic field sensor 20, wherein a rear stage magnetic field measurement is measured by the first magnetic field sensor 20: and Step B8: calculating a second near magnetic field variation by the data processing unit 10 from (1) the rear stage magnetic field measurement, or (2) a rear stage magnetic field component of the rear stage magnetic field measurement along the characteristic direction (for example the Z-axis direction), wherein the second near magnetic field variation is occurred since the moveable apparatus 5 (vehicle 50) leaves the moveable apparatus parking place 30.

The server 12 may collect the information of the moveable apparatus 5 (vehicle 50), wherein the information may include (1) the unique identifier of the moveable apparatus 5 (vehicle 50), (2) the time the moveable apparatus 5 (vehicle 50) entered the moveable apparatus parking place 30 (parking grid), and (3) the time the moveable apparatus 5 (vehicle 50) left the moveable apparatus parking place 30 (parking grid). The server 12 may also collect the result calculated by the data processing unit 10 and the data measured by the first magnetic field sensor 20.

In some embodiments, the magnetic field generator 8 may have a rechargeable battery (not shown in Figure). The magnetic field generator 8 may be designed having the mechanism as follows: (1) when the moveable apparatus 5 (vehicle 50) is turned on, the rechargeable battery of the magnetic field generator 8 is connected to a battery of the moveable apparatus 5 (vehicle 50) or the electric system of the moveable apparatus 5 (vehicle 50), so that the rechargeable battery of the magnetic field generator 8 can be charged, and (2) when the moveable apparatus 5 (vehicle 50) is turned off, the magnetic field generator 8 starts generating a magnetic field signal, and the rechargeable battery of the magnetic field generator 8 is disconnected from the battery of the moveable apparatus 5 (vehicle 50) or the electric system of the moveable apparatus 5 (vehicle 50), so that the rechargeable battery of the magnetic field generator 8 cannot be charged. Hence the magnetic field generator 8 will stop generating the magnetic field signal when the rechargeable battery of the magnetic field generator 8 is out of battery. The rechargeable battery of the magnetic field generator 8 may be designed having smaller battery capacity. For example, after the magnetic field generator 8 starts generating the magnetic field signal for 5 minutes, the rechargeable battery of the magnetic field generator 8 will be out of battery. Therefore, when the moveable apparatus 5 (vehicle 50) enters the moveable apparatus parking place 30, the system and method for parking detection and identification of moveable apparatus of the present invention detects the first near magnetic field variation (the Step B2). When the moveable apparatus 5 (vehicle 50) is turned off, the magnetic field generator 8 starts generating a magnetic field signal (the Step B3). Then, in the Step B4, the magnetic field measurement is measured by the first magnetic field sensor 20. In the Step B5, the unique identifier for identifying the moveable apparatus 5 (vehicle 50) is obtained by the data processing unit 10 from (1) the magnetic field measurement, or (2) a magnetic field component of the magnetic field measurement along the characteristic direction (for example the Z-axis direction). Then, after the magnetic field generator 8 generates the magnetic field signal for 5 minutes, the rechargeable battery of the magnetic field generator 8 is out of battery, so that the magnetic field generator 8 stops generating the magnetic field signal (the Step B6). After that, the first magnetic field sensor 20 continues measuring magnetic field (Step B7). The second near magnetic field variation is detected when the moveable apparatus 5 (vehicle 50) leaves the moveable apparatus parking place 30 (the Step B8).

Figure 4:
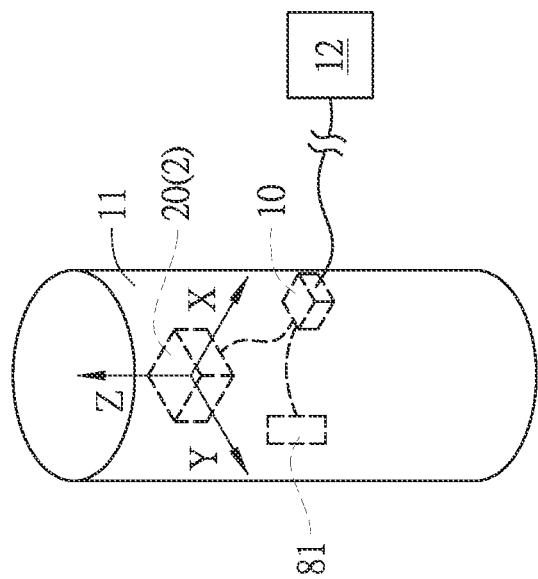
FIG. 4 is the schematic perspective view of another embodiment of the detecting module of system and method for parking detection and identification of moveable apparatus of the present invention.

Please refer to FIGS. 2A, 2B and 4, wherein FIG. 4 is the schematic perspective view of another embodiment of the detecting module of system and method for parking detection and identification of moveable apparatus of the present invention. The main structure of the embodiment of FIG. 4 is basically the same as the structure of the embodiment of FIG. 2C, except that the magnetic field sensing apparatus 2 comprises a first magnetic field sensor 20 (there is no such a second magnetic field sensor 21). In the embodiment of FIG. 4, the system for parking detection and identification of moveable apparatus of the present invention comprises the magnetic field sensing apparatus 2, the data processing unit 10, the magnetic field generator 8, the receiver 80 and the transmitter 81. The magnetic field sensing apparatus 2, the data processing unit 10 and the transmitter 81 are disposed in the detecting module 11, wherein the detecting module 11 (including the magnetic field sensing apparatus 2, the data processing unit 10 and the transmitter 81) is disposed in the peripheral area 40 of the moveable apparatus parking place 30 (in general, the peripheral area 40 may be any location of the above, the under, and the surrounding of the moveable apparatus parking place 30). In current embodiment, the moveable apparatus parking place 30 is a parking grid: the moveable apparatus 5 is a vehicle 50; wherein the detecting module 11 (including the magnetic field sensing apparatus 2, the data processing unit 10 and the transmitter 81) is disposed under the ground of the parking grid. The magnetic field generator 8 and the receiver 80 are disposed in the moveable apparatus 5 (vehicle 50). The receiver 80 is connected to the magnetic field generator 8 in a wired manner. The magnetic field sensing apparatus 2 (the first magnetic field sensor 20) is connected to the data processing unit 10 in a wired manner; wherein a Z-axis direction of the first magnetic field sensor 20 is upward; the transmitter 81 is also connected to the data processing unit 10 in a wired manner; the data processing unit 10 is connected to a server 12 in a wired manner. The method for parking detection and identification of moveable apparatus of the present invention comprises following steps of: Step B1 (the front detection stage): measuring magnetic field by the first magnetic field sensor 20 of the magnetic field sensing apparatus 2, wherein the magnetic field sensing apparatus 2 is disposed in the peripheral area 40 of the moveable apparatus parking place 30, wherein a front stage magnetic field measurement is measured by the first magnetic field sensor 20; Step B2 (the front detection stage): calculating a first near magnetic field variation by the data processing unit 10 from (1) the front stage magnetic field measurement, or (2) a front stage magnetic field component of the front stage magnetic field measurement along a characteristic direction (for example the Z-axis direction), wherein the first near magnetic field variation is occurred since the moveable apparatus 5 (vehicle 50) enters the moveable apparatus parking place 30; Step B21 (the middle identification stage): emitting a starting signal by the transmitter 81; Step B22 (the middle identification stage): receiving the starting signal by the receiver 80 disposed in the moveable apparatus 5 (vehicle 50): Step B3' (the middle identification stage): generating a magnetic field signal by the magnetic field generator 8 disposed in the moveable apparatus 5 (vehicle 50), wherein the magnetic field generator 8 is activated by the starting signal to start generating the magnetic field signal, wherein the magnetic field signal contains an unique identifier for identifying the moveable apparatus 5 (vehicle 50): Step B4 (the middle identification stage): measuring magnetic field by the first magnetic field sensor 20, wherein a magnetic field measurement is measured by the first magnetic field sensor 20: and Step B5 (the middle identification stage): obtaining the unique identifier for identifying the moveable apparatus 5 (vehicle 50) by the data processing unit 10 from (1) the magnetic field measurement, or (2) a magnetic field component of the magnetic field measurement along the characteristic direction (for example the Z-axis direction). Hence, the system and method for parking detection and identification of moveable apparatus of the present invention indeed can achieve that to use the magnetic field sensing apparatus 2 to detect if the moveable apparatus 5 (vehicle 50) enters the moveable apparatus parking place 30 (parking grid) and to use the same magnetic field sensing apparatus 2 to identification the moveable apparatus 5 (vehicle 50).

In some embodiments, after the Step B5, the method for parking detection and identification of moveable apparatus of the present invention further comprises following steps of (the rear detection stage): Step B6: stopping generating the magnetic field signal by the magnetic field generator 8, wherein the Step B6 comprises following steps of: Step B61: emitting a terminating signal by the transmitter 81; and Step B62: receiving the terminating signal by the receiver 80, wherein the magnetic field generator 8 is stopped generating the magnetic field signal by the terminating signal; Step B7: measuring magnetic field by the first magnetic field sensor 20, wherein a rear stage magnetic field measurement is measured by the first magnetic field sensor 20; and Step B8: calculating a second near magnetic field variation by the data processing unit 10 from (1) the rear stage magnetic field measurement, or (2) a rear stage magnetic field component of the rear stage magnetic field measurement along the characteristic direction (for example the Z-axis direction), wherein the second near magnetic field variation is occurred since the moveable apparatus 5 (vehicle 50) leaves the moveable apparatus parking place 30.

In some embodiments, in the Step B3 or the Step BY, the unique identifier is Morse-code encoded; in the Step B5, the unique identifier is obtained from (0) the magnetic field measurement, or (2) a magnetic field component of the magnetic field measurement along the characteristic direction (for example the Z-axis direction) via Morse-code decoding.

In some embodiments, in the Step B3 or the Step BY, the unique identifier is encrypted and then Morse-code encoded; in the Step B5, the unique identifier is obtained from (1) the magnetic field measurement, or (2) a magnetic field component of the magnetic field measurement along the characteristic direction (for example the Z-axis direction) via Morse-code decoding and then decrypting.

Figure 5A:
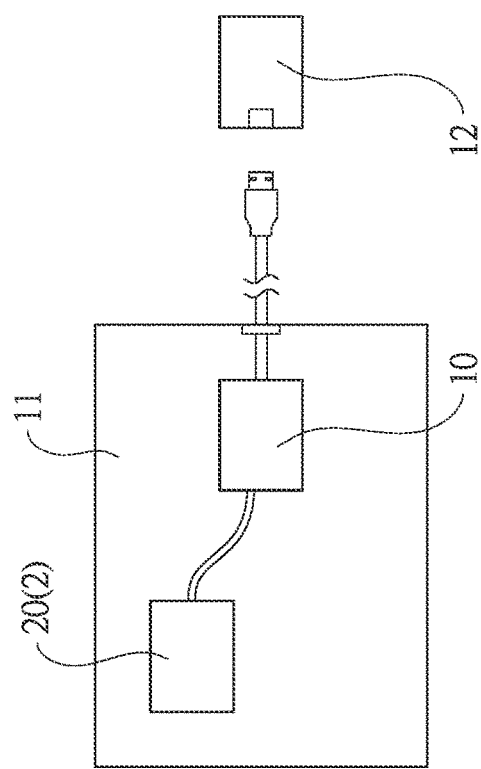
FIGS. 5A~5E are cross-sectional schematic views of embodiments of the detecting module of system for parking detection and identification of moveable apparatus of the present invention.
Figure 5B:
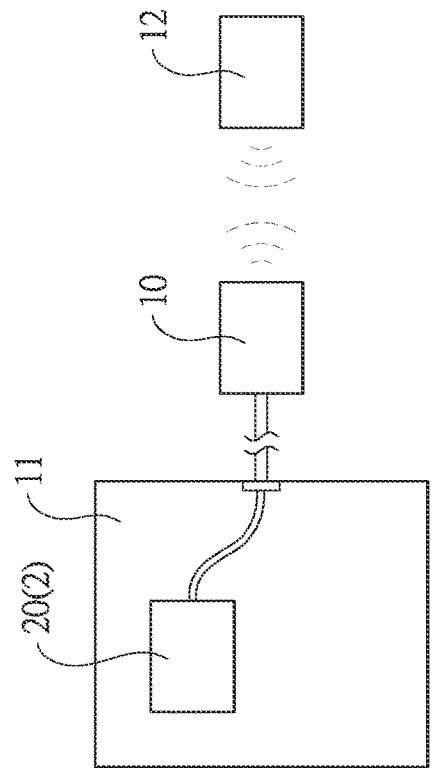
Figure 5C:
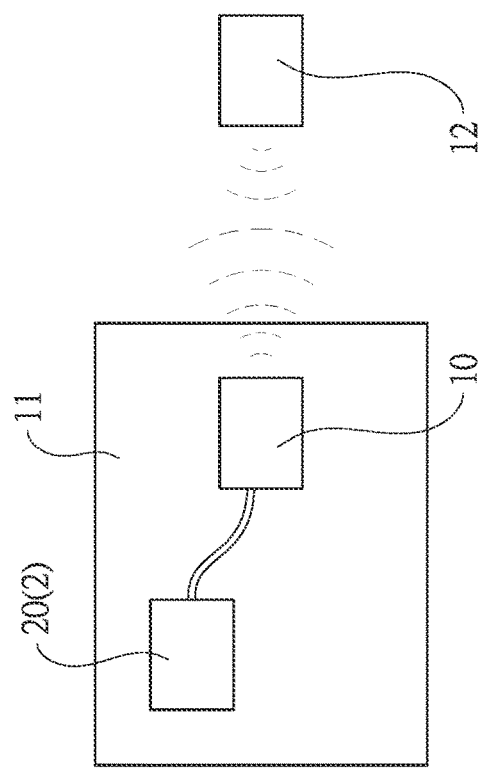
Figure 5D:
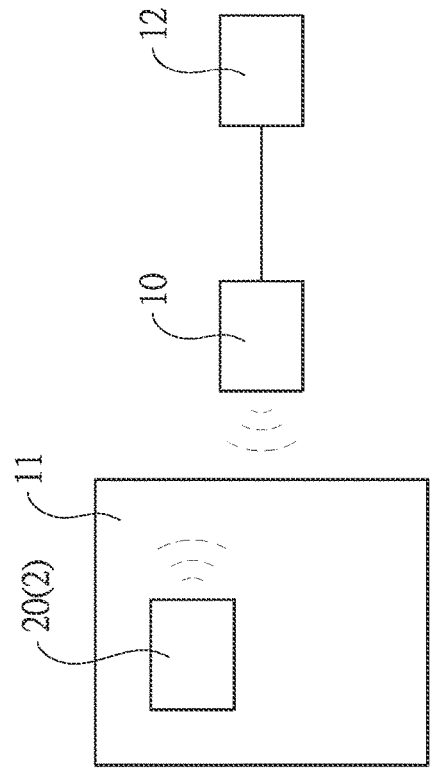
Figure 5E:
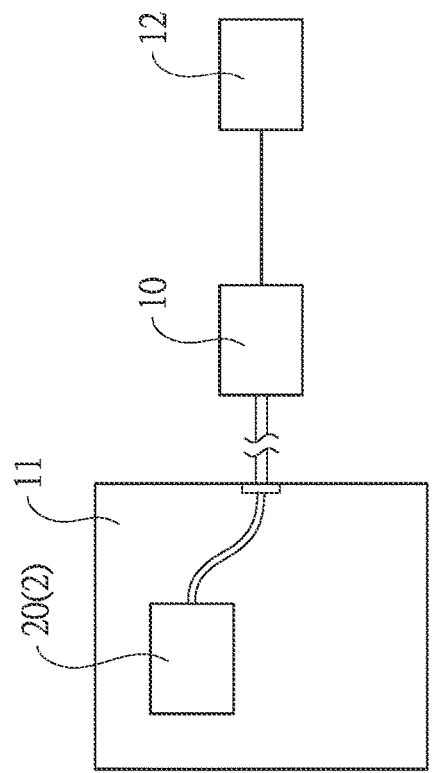

Please refer to FIGS. 5A-5E, which are cross-sectional schematic views of embodiments of the detecting module of system for parking detection and identification of moveable apparatus of the present invention. In the embodiment of FIG. 5A, the data processing unit 10 and the magnetic field sensing apparatus 2 (the first magnetic field sensor 20) are disposed in the detecting module 11. The first magnetic field sensor 20 is connected to the data processing unit 10 in a wired manner. The data processing unit 10 has the wireless transmission function so that the data measured by the first magnetic field sensor 20, the result calculated by the data processing unit 10 and the information of the moveable apparatus 5 (vehicle 50) can be transmitted to the server 12 through wireless communication. In the embodiment of FIG. 5B, the data processing unit 10 and the magnetic field sensing apparatus 2 are disposed in the detecting module 11. The first magnetic field sensor 20 is connected to the data processing unit 10 in a wired manner. The data processing unit 10 can be connected to the server 12 in a wired manner. The data measured by the first magnetic field sensor 20, the result calculated by the data processing unit 10 and the information of the moveable apparatus 5 (vehicle 50) can be transmitted to the server 12 through wire. In the embodiment of FIG. 5C, the magnetic field sensing apparatus 2 is disposed in the detecting module 11. The data processing unit 10 is not disposed in the detecting module 11. The data processing unit 10 is connected to the server 12 in a wired manner. The first magnetic field sensor 20 has the wireless transmission function so that the data measured by the first magnetic field sensor 20 can be transmitted to the data processing unit 10 through wireless communication. And then the data measured by the first magnetic field sensor 20, the result calculated by the data processing unit 10 and the information of the moveable apparatus 5 (vehicle 50) can be transmitted to the server 12 through wire. In the embodiment of FIG. 5D, the magnetic field sensing apparatus 2 is disposed in the detecting module 11. The data processing unit 10 is not disposed in the detecting module 11. The magnetic field sensing apparatus 2 (the first magnetic field sensor 20) is connected to the data processing unit 10 in a wired manner. The data processing unit 10 has the wireless transmission function so that the data measured by the first magnetic field sensor 20, the result calculated by the data processing unit 10 and the information of the moveable apparatus 5 (vehicle 50) can be transmitted to the server 12 through wireless communication. In the embodiment of FIG. 5E, the magnetic field sensing apparatus 2 is disposed in the detecting module 11. The data processing unit 10 is not disposed in the detecting module 11. The magnetic field sensing apparatus 2 (the first magnetic field sensor 20) is connected to the data processing unit 10 in a wired manner. The data processing unit 10 is connected to the server 12 in a wired manner. The data measured by the first magnetic field sensor 20, the result calculated by the data processing unit 10 and the information of the moveable apparatus 5 (vehicle 50) can be transmitted to the server 12 through wire.

Figure 6A:
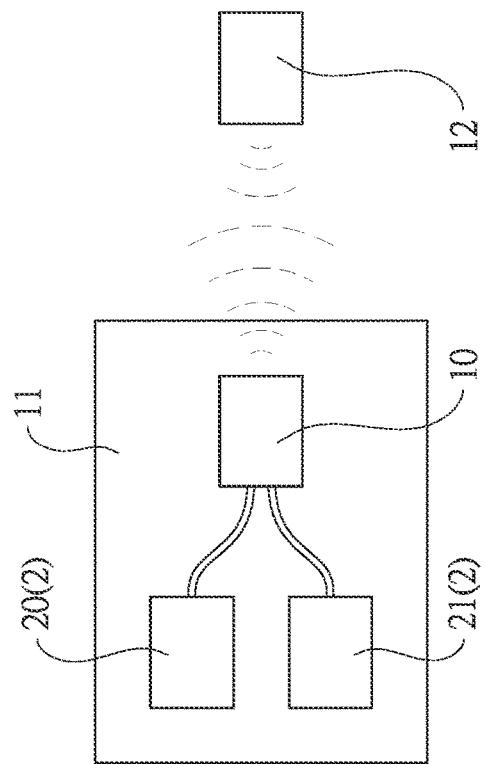
FIGS. 6A~6E are cross-sectional schematic views of embodiments of the detecting module of system for parking detection and identification of moveable apparatus of the present invention.
Figure 6C:
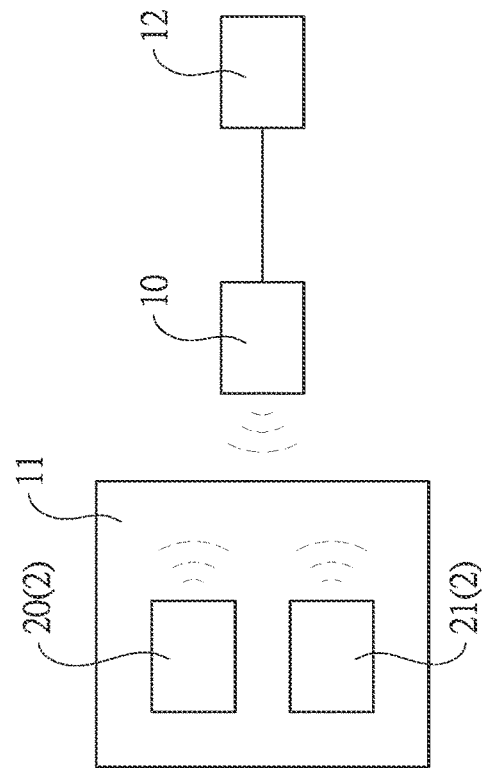
Figure 6B:
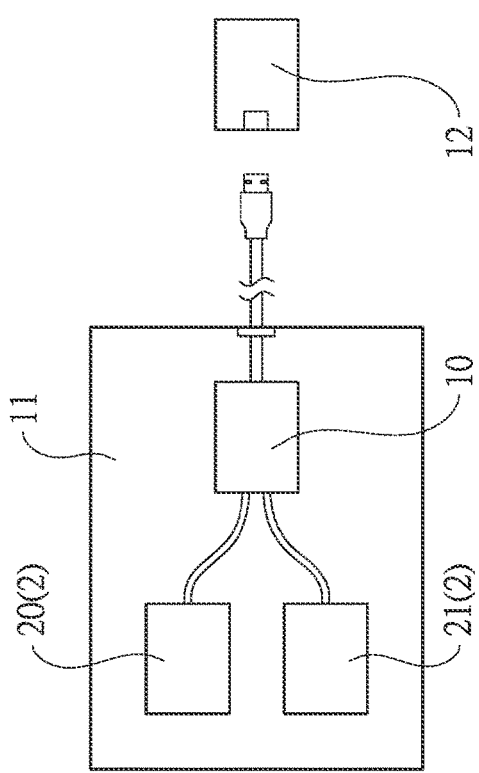
Figure 6D:
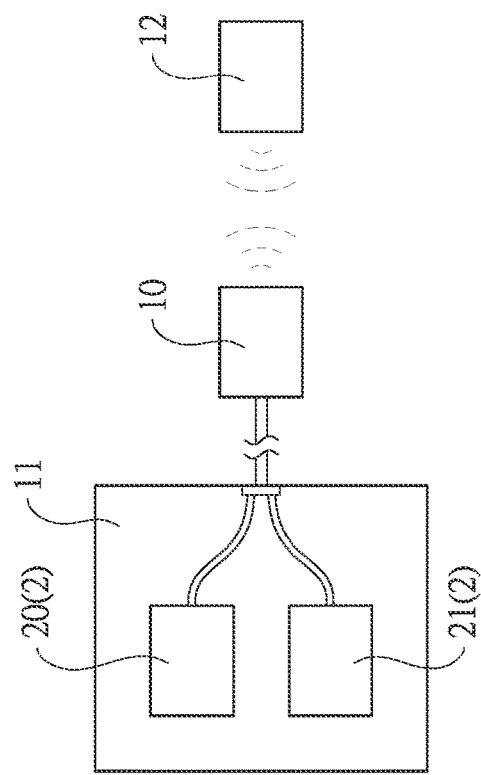
Figure 6E:
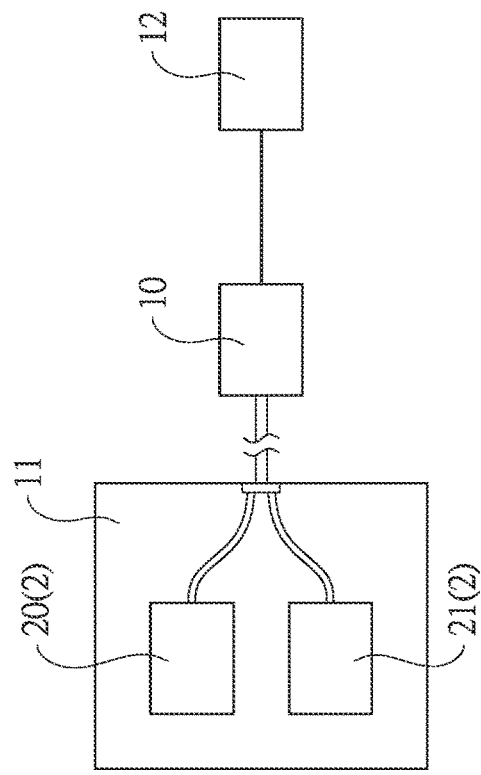

Please refer to FIGS. 6A-6E, which are cross-sectional schematic views of embodiments of the detecting module of system for parking detection and identification of moveable apparatus of the present invention. In the embodiment of FIG. 6A, the data processing unit 10 and the magnetic field sensing apparatus 2 (including the first magnetic field sensor 20 and the second magnetic field sensor 21) are disposed in the detecting module 11. The first magnetic field sensor 20 and the second magnetic field sensor 21 are connected to the data processing unit 10 in a wired manner, respectively. The data processing unit 10 has the wireless transmission function so that the data measured by the first magnetic field sensor 20 and the second magnetic field sensor 21, the result calculated by the data processing unit 10 and the information of the moveable apparatus 5 (vehicle 50) can be transmitted to the server 12 through wireless communication. In the embodiment of FIG. 6B, the data processing unit 10 and the magnetic field sensing apparatus 2 are disposed in the detecting module 11. The first magnetic field sensor 20 and the second magnetic field sensor 21 are connected to the data processing unit 10 in a wired manner, respectively. The data processing unit 10 can be connected to the server 12 in a wired manner. The data measured by the first magnetic field sensor 20 and the second magnetic field sensor 21, the result calculated by the data processing unit 10 and the information of the moveable apparatus 5 (vehicle 50) can be transmitted to the server 12 through wire. In the embodiment of FIG. 6C, the magnetic field sensing apparatus 2 is disposed in the detecting module 11. The data processing unit 10 is not disposed in the detecting module 11. The data processing unit 10 is connected to the server 12 in a wired manner. The first magnetic field sensor 20, the second magnetic field sensor 21 and the data processing unit 10 have the wireless transmission function so that the data measured by the first magnetic field sensor 20 and the second magnetic field sensor 21 can be transmitted to the data processing unit 10 through wireless communication. And then the data measured by the first magnetic field sensor 20 and the second magnetic field sensor 21, the result calculated by the data processing unit 10 and the information of the moveable apparatus 5 (vehicle 50) can be transmitted to the server 12 through wire. In the embodiment of FIG. 6D, the magnetic field sensing apparatus 2 is disposed in the detecting module 11. The data processing unit 10 is not disposed in the detecting module 11. The magnetic field sensing apparatus 2 (including the first magnetic field sensor 20 and the second magnetic field sensor 21) is connected to the data processing unit 10 in a wired manner. The data processing unit 10 has the wireless transmission function so that the data measured by the first magnetic field sensor 20 and the second magnetic field sensor 21, the result calculated by the data processing unit 10 and the information of the moveable apparatus 5 (vehicle 50) can be transmitted to the server 12 through wireless communication. In the embodiment of FIG. 6E, the magnetic field sensing apparatus 2 is disposed in the detecting module 11. The data processing unit 10 is not disposed in the detecting module 11. The magnetic field sensing apparatus 2 (including the first magnetic field sensor 20 and the second magnetic field sensor 21) is connected to the data processing unit 10 in a wired manner. The data processing unit 10 is connected to the server 12 in a wired manner. The data measured by the first magnetic field sensor 20 and the second magnetic field sensor 21, the result calculated by the data processing unit 10 and the information of the moveable apparatus 5 (vehicle 50) can be transmitted to the server 12 through wire.

Figure 7A:
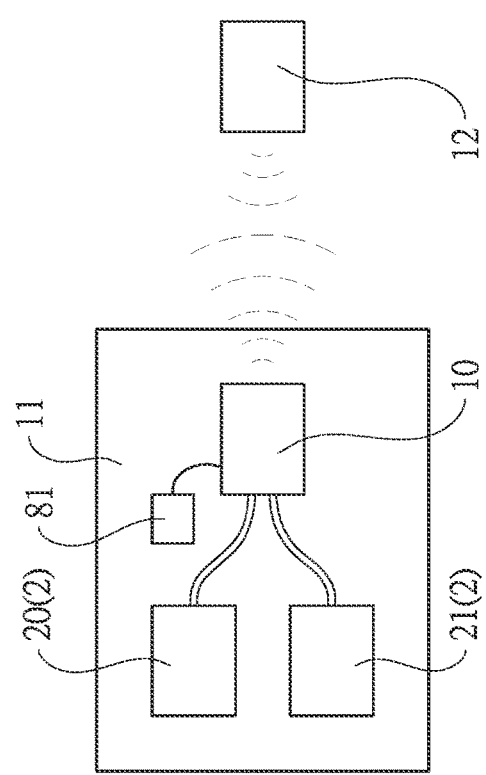
FIGS. 7A~7E are cross-sectional schematic views of embodiments of the detecting module of system for parking detection and identification of moveable apparatus of the present invention.
Figure 7B:
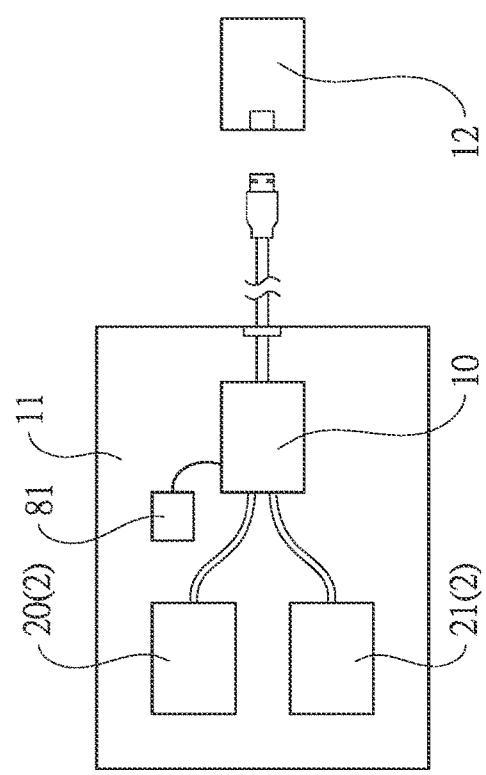
Figure 7C:
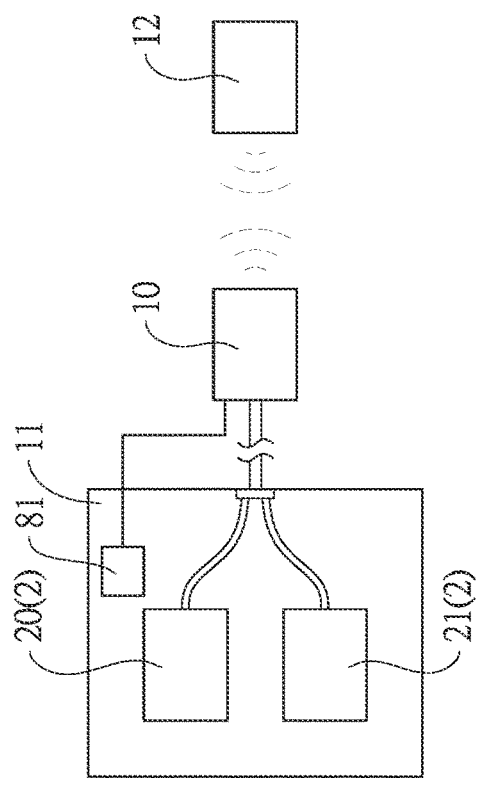
Figure 7D:
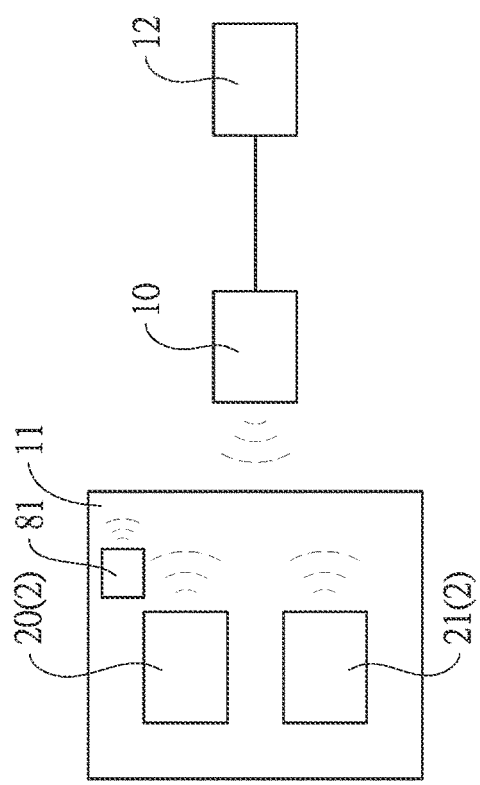
Figure 7E:
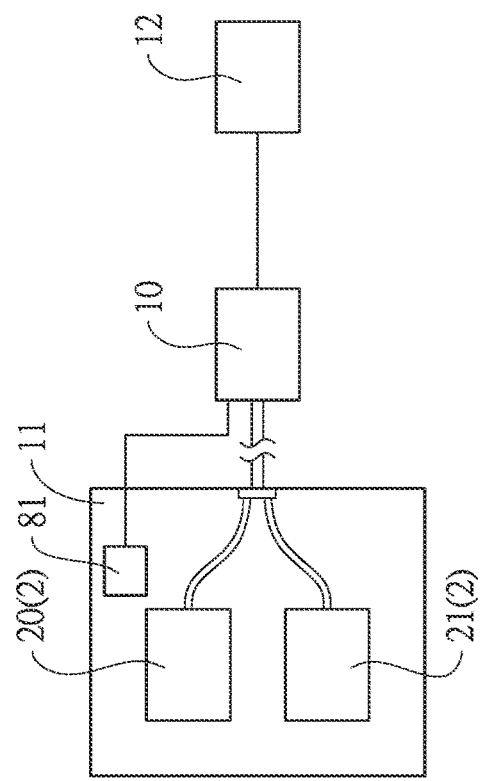

Please refer to FIGS. 7A-7E, which are cross-sectional schematic views of embodiments of the detecting module of system for parking detection and identification of moveable apparatus of the present invention. In the embodiment of FIG. 7A, the data processing unit 10, the transmitter 81 and the magnetic field sensing apparatus 2 (including the first magnetic field sensor 20 and the second magnetic field sensor 21) are disposed in the detecting module 11. The first magnetic field sensor 20 and the second magnetic field sensor 21 are connected to the data processing unit 10 in a wired manner, respectively. The transmitter 81 is connected to the data processing unit 10 in a wired manner. The data processing unit 10 has the wireless transmission function so that the data measured by the first magnetic field sensor 20 and the second magnetic field sensor 21, the result calculated by the data processing unit 10 and the information of the moveable apparatus 5 (vehicle 50) can be transmitted to the server 12 through wireless communication. In the embodiment of FIG. 7B, the data processing unit 10, the transmitter 81 and the magnetic field sensing apparatus 2 are disposed in the detecting module 11. The first magnetic field sensor 20 and the second magnetic field sensor 21 are connected to the data processing unit 10 in a wired manner, respectively. The transmitter 81 is connected to the data processing unit 10 in a wired manner. The data processing unit 10 can be connected to the server 12 in a wired manner. The data measured by the first magnetic field sensor 20 and the second magnetic field sensor 21, the result calculated by the data processing unit 10 and the information of the moveable apparatus 5 (vehicle 50) can be transmitted to the server 12 through wire. In the embodiment of FIG. 7C, the magnetic field sensing apparatus 2 and the transmitter 81 are disposed in the detecting module 11. The data processing unit 10 is not disposed in the detecting module 11. The data processing unit 10 is connected to the server 12 in a wired manner. The data processing unit 10, the transmitter 81, the first magnetic field sensor 20 and the second magnetic field sensor 21 have the wireless transmission function so that the transmitter 81 can communicate with the data processing unit 10 through wireless communication and the data measured by the first magnetic field sensor 20 and the second magnetic field sensor 21 can be transmitted to the data processing unit 10 through wireless communication. And then the data measured by the first magnetic field sensor 20 and the second magnetic field sensor 21, the result calculated by the data processing unit 10 and the information of the moveable apparatus 5 (vehicle 50) can be transmitted to the server 12 through wire. In the embodiment of FIG. 7D, the magnetic field sensing apparatus 2 and the transmitter 81 are disposed in the detecting module 11. The data processing unit 10 is not disposed in the detecting module 11. The magnetic field sensing apparatus 2 (including the first magnetic field sensor 20 and the second magnetic field sensor 21) is connected to the data processing unit 10 in a wired manner. The transmitter 81 is connected to the data processing unit 10 in a wired manner. The data processing unit 10 and the server 12 have the wireless transmission function so that the data measured by the first magnetic field sensor 20 and the second magnetic field sensor 21, the result calculated by the data processing unit 10 and the information of the moveable apparatus 5 (vehicle 50) can be transmitted to the server 12 through wireless communication. In the embodiment of FIG. 7E, the magnetic field sensing apparatus 2 and the transmitter 81 are disposed in the detecting module 11. The data processing unit 10 is not disposed in the detecting module 11. The magnetic field sensing apparatus 2 (including the first magnetic field sensor 20 and the second magnetic field sensor 21) is connected to the data processing unit 10 in a wired manner. The transmitter 81 is connected to the data processing unit 10 in a wired manner. The data processing unit 10 is connected to the server 12 in a wired manner. The data measured by the first magnetic field sensor 20 and the second magnetic field sensor 21, the result calculated by the data processing unit 10 and the information of the moveable apparatus 5 (vehicle 50) can be transmitted to the server 12 through wire.

Figure 8B:
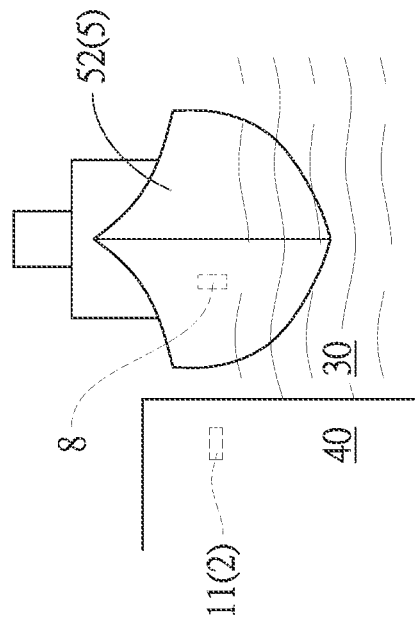
FIGS. 8A and 8B are the schematic perspective view and cross-sectional schematic view showing another embodiment of system and method for parking detection and identification of moveable apparatus of the present invention.
Figure 8A:
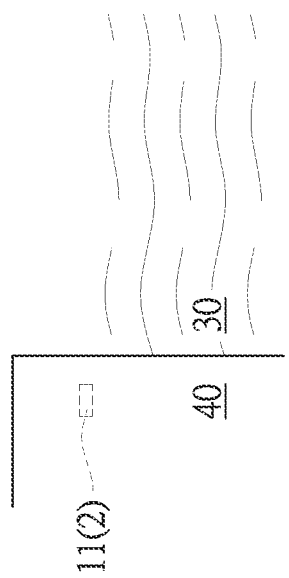

Please refer to FIGS. 8A and 8B, which are the schematic perspective view and cross-sectional schematic view showing another embodiment of system and method for parking detection and identification of moveable apparatus of the present invention. Please also refer to FIG. 1C. The detecting module 11 of FIGS. 8A and 8B has the same structure as the detecting module 11 of FIG. 1C. In current embodiment, the moveable apparatus parking place 30 is a dock. The peripheral area 40 is a side wall of the dock. The moveable apparatus 5 is a ship 52. The detecting module 11 (including the magnetic field sensor set 2 and the data processing unit 10) is disposed in the side wall of the dock (the peripheral area 40). The magnetic field generator 8 is disposed in the moveable apparatus 5 (ship 52). In current embodiment, the method for parking detection and identification of moveable apparatus of the present invention comprises following steps of; Step A1 (the front detection stage): measuring magnetic field by the first magnetic field sensor 20 and the second magnetic field sensor 21 of the magnetic field sensing apparatus 2 respectively, wherein the magnetic field sensing apparatus 2 is disposed in the peripheral area 40 of the moveable apparatus parking place 30 (the side wall of the dock), wherein a front stage first magnetic field measurement and a front stage second magnetic field measurement are measured by the first magnetic field sensor 20 and the second magnetic field sensor 21 respectively: Step A2 (the front detection stage): calculating a front stage magnetic field measurement difference by the data processing unit 10, wherein the front stage magnetic field measurement difference is (1) a magnitude of a difference of the front stage first magnetic field measurement and the front stage second magnetic field measurement, or (2) a magnitude of a difference of a front stage first magnetic field component of the front stage first magnetic field measurement along a characteristic direction (for example the direction of the line determined by the first magnetic field sensor 20 and the second magnetic field sensor 21, wherein the direction is approximately pointing to the moveable apparatus parking place 30 (dock)) and a front stage second magnetic field component of the front stage second magnetic field measurement along the characteristic direction, wherein a first near magnetic field variation is occurred when (a) the front stage magnetic field measurement difference is continuously greater than a first characteristic threshold within a first characteristic time period, or (b) an average value of the front stage magnetic field measurement difference is greater than a first characteristic average threshold within a first characteristic average time period, wherein the first near magnetic field variation is occurred since the moveable apparatus 5 (ship 52) enters the moveable apparatus parking place 30 (dock); Step A3 (the middle identification stage): generating a magnetic field signal by the magnetic field generator 8 disposed in the moveable apparatus 5 (ship 52), wherein the magnetic field signal contains an unique identifier for identifying the moveable apparatus 5 (ship 52); Step A4 (the middle identification stage): measuring magnetic field by the first magnetic field sensor 20 and the second magnetic field sensor 21 respectively, wherein a first magnetic field measurement and a second magnetic field measurement are measured by the first magnetic field sensor 20 and the second magnetic field sensor 21 respectively; and Step A5 (the middle identification stage): calculating a magnetic field measurement difference by the data processing unit 10 to obtain the unique identifier for identifying the moveable apparatus 5 (ship 52) from the magnetic field measurement difference, wherein the magnetic field measurement difference is (1) a magnitude of a difference of the first magnetic field measurement and the second magnetic field measurement, or (2) a magnitude of a difference of a first magnetic field component of the first magnetic field measurement along the characteristic direction (for example the direction of the line determined by the first magnetic field sensor 20 and the second magnetic field sensor 21, wherein the direction is approximately pointing to the moveable apparatus parking place 30 (dock)) and a second magnetic field component of the second magnetic field measurement along the characteristic direction.

In some embodiments, after the Step A5, the method for parking detection and identification of moveable apparatus of the present invention further comprises following steps of (the rear detection stage): Step A6: stopping generating the magnetic field signal by the magnetic field generator 8: Step A7: measuring magnetic field by the first magnetic field sensor 20 and the second magnetic field sensor 21 of the magnetic field sensing apparatus 2 respectively, wherein a rear stage first magnetic field measurement and a rear stage second magnetic field measurement are measured by the first magnetic field sensor 20 and the second magnetic field sensor 21 respectively; and Step A8: calculating a rear stage magnetic field measurement difference by the data processing unit 10, wherein the rear stage magnetic field measurement difference is (1) a magnitude of a difference of the rear stage first magnetic field measurement and the rear stage second magnetic field measurement, or (2) a magnitude of a difference of a rear stage first magnetic field component of the rear stage first magnetic field measurement along the characteristic direction (for example the direction of the line determined by the first magnetic field sensor 20 and the second magnetic field sensor 21, wherein the direction is approximately pointing to the moveable apparatus parking place 30 (dock)) and a rear stage second magnetic field component of the rear stage second magnetic field measurement along the characteristic direction, wherein a second near magnetic field variation is occurred when (a) the rear stage magnetic field measurement difference is continuously smaller than a second characteristic threshold within a second characteristic time period, or (b) an average value of the rear stage magnetic field measurement difference is smaller than a second characteristic average threshold within a second characteristic average time period, wherein the second near magnetic field variation is occurred since the moveable apparatus 5 (ship 52) leaves the moveable apparatus parking place 30 (dock).

The moveable apparatus 5 may be a transportation vehicle, wherein the transportation vehicle is one selected from the group consisting of: a land vehicle, a sea vehicle, a flight vehicle, a tram, a cable car, and a railed vehicle.

In some embodiments, the characteristic direction may be approximately pointing to the moveable apparatus parking place 30. In some embodiments, the characteristic direction may be approximately parallel to a geomagnetic inclination direction of the location of the moveable apparatus parking place 30. In some embodiments, the characteristic direction may be approximately parallel to a geomagnetic declination direction of the location of the moveable apparatus parking place 30. In some embodiments, a direction of a line determined by the first magnetic field sensor 20 and the second magnetic field sensor 21 is approximately parallel to the characteristic direction. In some embodiments, a direction of a line determined by the first magnetic field sensor 20 and the second magnetic field sensor 21 is approximately pointing to the moveable apparatus parking place 30.

In some other embodiments, the encode/decode method can be other conventional encode/decode method. In some other embodiments, the encrypt/decrypt method can be the conventional encrypt/decrypt method. For example, an ASCII-code encrypt/decrypt method.

As disclosed in the above description and attached drawings, the present invention can provide a system and method for parking detection and identification of moveable apparatus. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A method for parking detection and identification of moveable apparatus, comprising following steps of:
   generating a magnetic field signal by a magnetic field generator disposed in said moveable apparatus, wherein an unique identifier for identifying said moveable apparatus is Morse-code encoded in said magnetic field signal; and
   measuring magnetic field by (a) a first magnetic field sensor and a second magnetic field sensor of a magnetic field sensing apparatus respectively and calculating a magnetic field measurement difference by a data processing unit for obtaining said unique identifier via Morse-code decoding from said magnetic field measurement difference, wherein said magnetic field sensing apparatus is disposed in a moveable apparatus parking place or a peripheral area of said moveable apparatus parking place, wherein a first magnetic field measurement and a second magnetic field measurement are measured by said first magnetic field sensor and said second magnetic field sensor respectively, wherein said magnetic field measurement difference is a magnitude of a difference of said first magnetic field measurement and said second magnetic field measurement, or a magnitude of a difference of a first magnetic field component of said first magnetic field measurement along a characteristic direction and a second magnetic field component of said second magnetic field measurement along said characteristic direction, or (b) one of a first magnetic field sensor and a second magnetic field sensor of a magnetic field sensing apparatus, a magnetic field measurement is measured, and obtaining said unique identifier via Morse-code decoding from said magnetic field measurement, or a magnetic field component of said magnetic field measurement along a characteristic direction by a data processing unit, wherein said magnetic field sensing apparatus is disposed in a moveable apparatus parking place or a peripheral area of said moveable apparatus parking place.

2. The method for parking detection and identification of the moveable apparatus according to claim 1, wherein before said magnetic field generator starts generating said magnetic field signal, said method further comprises following steps of:
   measuring magnetic field by said first magnetic field sensor and said second magnetic field sensor respectively, wherein a front stage first magnetic field measurement and a front stage second magnetic field measurement are measured by said first magnetic field sensor and said second magnetic field sensor respectively; and
   calculating a front stage magnetic field measurement difference by said data processing unit, wherein said front stage magnetic field measurement difference is a magnitude of a difference of said front stage first magnetic field measurement and said front stage second magnetic field measurement, or a magnitude of a difference of a front stage first magnetic field component of said front stage first magnetic field measurement along said characteristic direction and a front stage second magnetic field component of said front stage second magnetic field measurement along said characteristic direction, wherein a first near magnetic field variation for detecting said moveable apparatus entering said moveable apparatus parking place is occurred when said front stage magnetic field measurement difference is continuously greater than a first characteristic threshold within a first characteristic time period, or an average value of said front stage magnetic field measurement difference is greater than a first characteristic average threshold within a first characteristic average time period.

3. The method for parking detection and identification of the moveable apparatus according to claim 1, wherein after said unique identifier is obtained, said method further comprises following steps of:
   stopping generating said magnetic field signal by said magnetic field generator;
   measuring magnetic field by said first magnetic field sensor and said second magnetic field sensor respectively, wherein a rear stage first magnetic field measurement and a rear stage second magnetic field measurement are measured by said first magnetic field sensor and said second magnetic field sensor respectively; and
   calculating a rear stage magnetic field measurement difference by said data processing unit, wherein said rear stage magnetic field measurement difference is a magnitude of a difference of said rear stage first magnetic field measurement and said rear stage second magnetic field measurement, or a magnitude of a difference of a rear stage first magnetic field component of said rear stage first magnetic field measurement along said characteristic direction and a rear stage second magnetic field component of said rear stage second magnetic field measurement along said characteristic direction, wherein a second near magnetic field variation for detecting said moveable apparatus leaving said moveable apparatus parking place is occurred when said rear stage magnetic field measurement difference is continuously smaller than a second characteristic threshold within a second characteristic time period, or an average value of said rear stage magnetic field measurement difference is smaller than a second characteristic average threshold within a second characteristic average time period.

4. The method for parking detection and identification of the moveable apparatus according to claim 3, wherein said step of stopping generating said magnetic field signal by said magnetic field generator comprises following steps of:
   emitting a terminating signal by a transmitter disposed in said moveable apparatus parking place or said peripheral area of said moveable apparatus parking place; and
   receiving said terminating signal by a receiver disposed in said moveable apparatus, wherein said magnetic field generator is stopped generating said magnetic field signal by said terminating signal.

5. The method for parking detection and identification of the moveable apparatus according to claim 1, wherein said step of generating said magnetic field signal by said magnetic field generator comprises following steps of:

emitting a starting signal by a transmitter disposed in said moveable apparatus parking place or said peripheral area of said moveable apparatus parking place; and receiving said starting signal by a receiver disposed in said moveable apparatus, wherein said magnetic field generator is activated to start generating said magnetic field signal by said starting signal.

6. The method for parking detection and identification of the moveable apparatus according to claim 1, wherein said moveable apparatus is one selected from the group consisting of: a land vehicle, a sea vehicle, a flight vehicle, a tram, a cable car, and a railed vehicle.

7. The method for parking detection and identification of the moveable apparatus according to claim 1, wherein said moveable apparatus parking place has an entrance, wherein said magnetic field sensing apparatus is disposed non-adjacent to said entrance.

8. The method for parking detection and identification of the moveable apparatus according to claim 1, wherein said peripheral area includes any one of the above, the under, and the surrounding of said moveable apparatus parking place.

9. The method for parking detection and identification of the moveable apparatus according to claim 1, wherein said characteristic direction is approximately pointing to said moveable apparatus parking place, approximately parallel to a geomagnetic inclination direction of the location of said moveable apparatus parking place, or approximately parallel to a geomagnetic declination direction of the location of said moveable apparatus parking place.

10. The method for parking detection and identification of the moveable apparatus according to claim 1, wherein a first distance between said first magnetic field sensor and said moveable apparatus parking place is not equal to a second distance between said second magnetic field sensor and said moveable apparatus parking place.

11. The method for parking detection and identification of the moveable apparatus according to claim 1, wherein a first distance between said first magnetic field sensor and said moveable apparatus parking place is greater than or equal to a sensor relative distance between said first magnetic field sensor and said second magnetic field sensor.

12. The method for parking detection and identification of the moveable apparatus according to claim 11, wherein a second distance between said second magnetic field sensor and said moveable apparatus parking place is greater than or equal to said sensor relative distance.

13. The method for parking detection and identification of the moveable apparatus according to claim 12, wherein said first distance is not equal to said second distance.

14. The method for parking detection and identification of the moveable apparatus according to claim 1, wherein a direction of a line determined by said first magnetic field sensor and said second magnetic field sensor is approximately parallel to said characteristic direction, or approximately pointing to said moveable apparatus parking place.

15. A system for parking detection and identification of moveable apparatus, comprising:

a data processing unit;

a magnetic field generator disposed in said moveable apparatus, wherein said magnetic field generator is used for generating a magnetic field signal, wherein an unique identifier for identifying said moveable apparatus is Morse-code encoded in said magnetic field signal; and a magnetic field sensing apparatus disposed in a moveable apparatus parking place or a peripheral area of said moveable apparatus parking place, wherein said magnetic field sensing apparatus includes a first magnetic field sensor and a second magnetic field sensor for measuring magnetic field respectively, wherein (a) a first magnetic field measurement and a second magnetic field measurement are measured by said first magnetic field sensor and said second magnetic field sensor respectively, said data processing unit calculates a magnetic field measurement difference for obtaining said unique identifier via Morse-code decoding from said magnetic field measurement difference, wherein said magnetic field measurement difference is a magnitude of a difference of said first magnetic field measurement and said second magnetic field measurement, or a magnitude of a difference of a first magnetic field component of said first magnetic field measurement along a characteristic direction and a second magnetic field component of said second magnetic field measurement along said characteristic direction; or (b) a magnetic field measurement is measured by one of said first magnetic field sensor and said second magnetic field sensor, said data processing unit obtains said unique identifier via Morse-code decoding from said magnetic field measurement, or a magnetic field component of said magnetic field measurement along a characteristic direction.

16. The system for parking detection and identification of the moveable apparatus according to claim 15, wherein before said magnetic field generator starts generating said magnetic field signal, a front stage first magnetic field measurement and a front stage second magnetic field measurement are measured by said first magnetic field sensor and said second magnetic field sensor respectively, said data processing unit calculates a front stage magnetic field measurement difference, wherein said front stage magnetic field measurement difference is a magnitude of a difference of said front stage first magnetic field measurement and said front stage second magnetic field measurement, or a magnitude of a difference of a front stage first magnetic field component of said front stage first magnetic field measurement along said characteristic direction and a front stage second magnetic field component of said front stage second magnetic field measurement along said characteristic direction, wherein a first near magnetic field variation for detecting said moveable apparatus entering said moveable apparatus parking place is occurred when said front stage magnetic field measurement difference is continuously greater than a first characteristic threshold within a first characteristic time period, or an average value of said front stage magnetic field measurement difference is greater than a first characteristic average threshold within a first characteristic average time period.

17. The system for parking detection and identification of the moveable apparatus according to claim 15, wherein after said unique identifier is obtained, said magnetic field generator stops generating said magnetic field signal, a rear stage first magnetic field measurement and a rear stage second magnetic field measurement are measured by said first magnetic field sensor and said second magnetic field sensor respectively, said data processing unit calculates a rear stage magnetic field measurement difference, wherein said rear stage magnetic field measurement difference is a magnitude of a difference of said rear stage first magnetic field measurement and said rear stage second magnetic field measurement, or a magnitude of a difference of a rear stage first magnetic field component of said rear stage first magnetic field measurement along said characteristic direction and a rear stage second magnetic field component of said rear stage second magnetic field measurement along said characteristic direction, wherein a second near magnetic field variation for detecting said moveable apparatus leaving said moveable apparatus parking place is occurred when said rear stage magnetic field measurement difference is continuously smaller than a second characteristic threshold within a second characteristic time period, or an average value of said rear stage magnetic field measurement difference is smaller than a second characteristic average threshold within a second characteristic average time period.

18. The system for parking detection and identification of the moveable apparatus according to claim 17, further comprising a receiver disposed in said moveable apparatus and a transmitter disposed in said moveable apparatus parking place or said peripheral area of said moveable apparatus parking place, wherein said transmitter is used for emitting a terminating signal, wherein when said receiver receives said terminating signal, said magnetic field generator is stopped generating said magnetic field signal by said terminating signal.

19. The system for parking detection and identification of the moveable apparatus according to claim 15, further comprising a receiver disposed in said moveable apparatus and a transmitter disposed in said moveable apparatus parking place or said peripheral area of said moveable apparatus parking place, wherein said transmitter is used for emitting a starting signal, wherein when said receiver receives said starting signal, said magnetic field generator is activated to start generating said magnetic field signal by said starting signal.

20. The system for parking detection and identification of the moveable apparatus according to claim 15, wherein said characteristic direction is approximately pointing to said moveable apparatus parking place, approximately parallel to a geomagnetic inclination direction of the location of said moveable apparatus parking place, or approximately parallel to a geomagnetic declination direction of the location of said moveable apparatus parking place.

* * * * *